United States Patent
Lesea et al.

(10) Patent No.: US 10,573,598 B2
(45) Date of Patent: Feb. 25, 2020

(54) INTEGRATION OF A PROGRAMMABLE DEVICE AND A PROCESSING SYSTEM IN AN INTEGRATED CIRCUIT PACKAGE

(71) Applicant: Xilinx, Inc., San Jose, CA (US)

(72) Inventors: Austin H. Lesea, Los Gatos, CA (US); Sundararajarao Mohan, Sunnyvale, CA (US); Stephen M. Trimberger, Incline Village, NV (US)

(73) Assignee: XILINX, INC., San Jose, CA (US)

( * ) Notice: Subject to any disclaimer, the term of this patent is extended or adjusted under 35 U.S.C. 154(b) by 58 days.

(21) Appl. No.: 15/719,288

(22) Filed: Sep. 28, 2017

(65) Prior Publication Data
US 2019/0096813 A1  Mar. 28, 2019

(51) Int. Cl.
*G06F 15/78* (2006.01)
*H01L 23/538* (2006.01)
*H01L 23/50* (2006.01)

(52) U.S. Cl.
CPC .......... *H01L 23/5386* (2013.01); *H01L 23/50* (2013.01)

(58) Field of Classification Search
None
See application file for complete search history.

(56) References Cited

U.S. PATENT DOCUMENTS

| | | | |
|---|---|---|---|
| 5,642,058 A * | 6/1997 | Trimberger | H03K 19/17704 326/101 |
| 7,187,709 B1 | 3/2007 | Menon et al. | |
| 7,551,564 B2 * | 6/2009 | Mattina | H04L 12/43 370/238 |
| 9,880,966 B1 * | 1/2018 | Hwang | G06F 13/4256 |
| 2003/0062922 A1 | 4/2003 | Douglass et al. | |
| 2017/0153892 A1 | 6/2017 | Linsky | |
| 2018/0040096 A1 * | 2/2018 | Benthin | G06T 1/20 |
| 2018/0137013 A1 * | 5/2018 | Poojary | G06F 3/0607 |
| 2018/0293205 A1 * | 10/2018 | Koker | G06F 15/8007 |
| 2018/0307429 A1 * | 10/2018 | Fu | G06F 3/0632 |
| 2018/0329855 A1 * | 11/2018 | Das Sharma | H04L 69/24 |
| 2019/0018799 A1 * | 1/2019 | Appu | G06F 12/128 |
| 2019/0052567 A1 * | 2/2019 | Muntz | H04L 47/122 |

OTHER PUBLICATIONS

Intel, "The Compute Architecture of Intel® Processor Graphics Gen8," v.1.1, Jul. 15, 2015, pp. 1-21, Intel Corp., Santa Clara, California, USA.
Xilinx, LogiCORE IP AXI DMA v7.1, PG021, Oct. 5, 2016, pp. 1-98, Xilinx, Inc., San Jose, California, USA.
Xilinx, LogiCORE IP AXI4-Stream Accelerator Adapter v2.1, PG081, Nov. 18, 2015, pp. 1-56, Xilinx, Inc., San Jose, California, USA.

* cited by examiner

*Primary Examiner* — Michael Sun
(74) *Attorney, Agent, or Firm* — Robert M. Brush

(57) ABSTRACT

An example integrated circuit (IC) package includes: a processing system and a programmable IC disposed on a substrate, the processing system coupled to the programmable IC through interconnect of the substrate; the processing system including components coupled to a ring interconnect, the components including a processor and an interface controller. The programmable IC includes: an interface endpoint coupled to the interface controller through the interconnect; and at least one peripheral coupled to the interface endpoint and configured for communication with the ring interconnect of the processing system through the interconnect endpoint and the interface controller.

18 Claims, 17 Drawing Sheets

INTEGRATION OF A PROGRAMMABLE DEVICE AND A PROCESSING SYSTEM IN AN INTEGRATED CIRCUIT PACKAGE

TECHNICAL FIELD

Examples of the present disclosure generally relate to electronic circuits and, in particular, to integration of a programmable device and a processing system in an integrated circuit (IC) package.

BACKGROUND

Modern central processing units (CPUs) are complex system on a chip (SoC) devices that integrate multiple microprocessor cores, graphics engines, and other fixed functions on a single semiconductor die. A CPU can include an expansion bus interface, such as the Peripheral Component Interconnect Express (PCIe) interface. In a typical configuration, an integrated circuit (IC) package having the CPU is mounted to a printed circuit board (PCB). Various peripherals are mounted to the PCB external to the CPU IC package in either fixed or removable fashion. The peripherals are coupled to the PCIe interface of the CPU through the PCB and pins of the CPU IC package. Such a configuration has a large footprint, requiring at least multiple ICs mounted on a PCB and at worst space for expansion ports into which other PCBs having the peripherals can be inserted.

Programmable integrated circuits (ICs) are often used to implement digital logic operations according to user configurable input. Example programmable ICs include complex programmable logic devices (CPLDs) and field programmable gate arrays (FPGAs). CPLDs often include several function blocks that are based on a programmable logic array (PLA) architecture with sum-of-products logic. A configurable interconnect matrix transmits signals between the function blocks.

One type of FPGA includes an array of programmable tiles. The programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth. Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

Programmable ICs can be used to implement peripherals for use by CPUs, such as for use as hardware accelerators. Hardware acceleration involves the use of hardware to perform some functions more efficiently than software executing on a general-purpose CPU. A hardware accelerator is special-purpose hardware designed to implement hardware acceleration for some application. Example applications include neural networks, video encoding, decoding, transcoding, etc., network data processing, and the like. Such hardware accelerators are typically implemented as PCIe cards that are inserted into slots on the motherboard. The CPU and programmable IC are two separate ICs that are physically separated by components on the motherboard. It is desirable to provide a more efficient implementation of a computing system having CPUs and programmable IC(s) used as peripherals.

SUMMARY

Integration of a programmable device and a processing system in an integrated circuit (IC) package is described. In an example, an IC package includes: a processing system and a programmable IC disposed on a substrate, the processing system coupled to the programmable IC through interconnect of the substrate; the processing system including components coupled to a ring interconnect, the components including a processor and an interface controller. The programmable IC includes: an interface endpoint coupled to the interface controller through the interconnect; and at least one peripheral coupled to the interface endpoint and configured for communication with the ring interconnect of the processing system through the interconnect endpoint and the interface controller.

In another example, an IC package includes: a processing system and a programmable IC disposed on a semiconductor die; the processing system including components coupled to a ring interconnect, the components including a processor and interface circuits; the programmable IC coupled to the ring interconnect and including at least one peripheral configured for communication with the ring interconnect.

In another example, an IC package includes: a processing system and a programmable IC disposed on a semiconductor die; the processing system including components coupled to a ring interconnect, the components including a processor, interface circuits, and memories; the programmable IC coupled to the ring interconnect and including at least one peripheral configured for communication with the ring interconnect and at least one memory.

In another example, an IC package includes: a processing system and a programmable IC disposed on a semiconductor die; the processing system including components coupled to a ring interconnect, the ring interconnect including a first sub-ring coupled to a second sub-ring through a ring-to-ring connector, the components including a processor and interface circuits; the programmable IC coupled to the first sub-ring and including at least one peripheral configured for communication with the first sub-ring.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
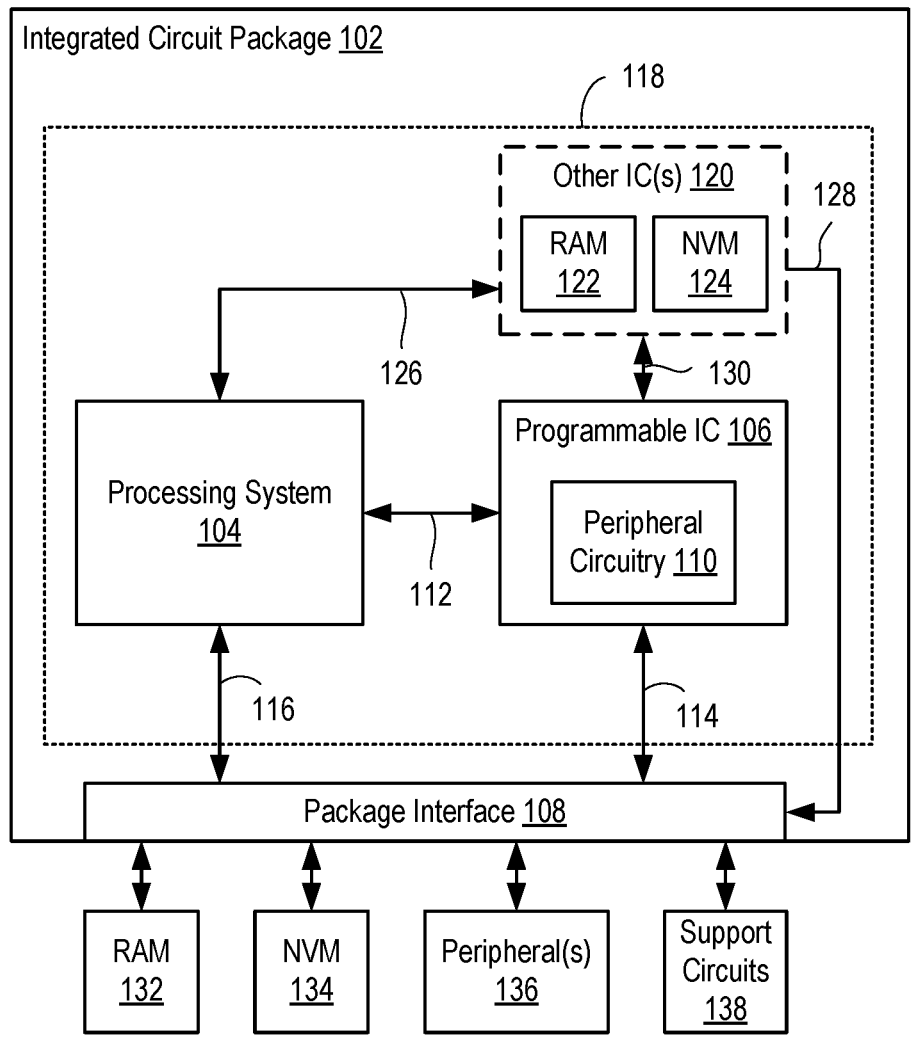
FIG. 1 is a block diagram depicting an integrated circuit (IC) package according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Integration of a programmable device and a processing system in an integrated circuit (IC) package is described. Example techniques described herein integrate a programmable fabric, such as a field programmable gate array (FPGA) fabric, into a high-performance processing system having a ring interconnect. In one example, an IC package includes a processing system and a programmable IC disposed on a substrate. The processing system and the programmable IC are coupled through interconnect of the substrate. The processing system includes components, which include a processor and an interface controller, coupled to a ring interconnect. The programmable IC includes an interface endpoint coupled to the interface controller through the interconnect on the substrate. The programmable IC also includes peripheral(s) coupled to the interface endpoint and configured for communication with the ring interconnect of the processing system through the interconnect endpoint and the interface controller. In an example, the programmable IC is connected to the ring interconnect of the processing system through a Peripheral Component Interface Express (PCIe) connection. In examples, the physical layer of the PCIe connection between the programmable IC and the processing system can be optimized based on known characteristics of the substrate interconnect between the programmable IC and the processing system. In other examples, optimized versions of other chip-to-chip interconnection protocols can be used instead of PCIe, such as Intel® Quickpath Interconnect (QPI), Omnipath, Infiniband, or the like. In this manner, peripherals implemented in the programmable IC can be used as accelerators for the processing system without requiring additional board space for PCIe sockets, and additional boards having the programmable IC with a PCIe connector.

In another example, an IC package includes a processing system and a programmable IC disposed on a semiconductor die (in contrast to being disposed in the same package). The processing system includes components (e.g., a processor and interface circuits) coupled to a ring interconnect. The programmable IC is coupled to the ring interconnect and includes peripheral(s) configured for communication with the ring interconnect.

In another example, an IC package includes a processing system and a programmable IC disposed on a semiconductor die (in contrast to being disposed in the same package). The processing system includes components (e.g., a processor interface circuits, and memories) coupled to a ring interconnect. The programmable IC is coupled to the ring interconnect and includes peripheral(s) configured for communication with the ring interconnect and the memories.

In another example, an IC package includes a processing system and a programmable IC disposed on a semiconductor die (in contrast to being disposed in the same package). The processing system includes components coupled to a ring interconnect. The ring interconnect including a first sub-ring coupled to a second sub-ring through a ring-to-ring connector. The components include a processor and interface circuits. The programmable IC is coupled to the first sub-ring and includes at least one peripheral configured for communication with the first sub-ring.

These and further aspects of the example techniques are described below with respect to the drawings.

FIG. 1 is a block diagram depicting an integrated circuit (IC) package 102 according to an example. The IC package 102 includes a processing system 104 and a programmable IC 106. The processing system 104 is implemented on a semiconductor die and includes one or more central processing units (CPUs) and other fixed functions, including a peripheral interface controller (e.g., a Peripheral Component Interconnect Express (PCIe) interface controller or the like). An example implementation of the processing system 104 is described below with respect to FIG. 2. The programmable IC 106 is implemented on another semiconductor die and can be a field programmable gate array (FPGA), complex programmable logic device (CPLD), a system-on-chip (SoC) having FPGA/CPLD functionality, or other type of programmable device. The processing system 104 and the programmable IC 106 are electrically and mechanically mounted to a substrate 118, such as an interposer, package substrate, or the like. The substrate 118 is disposed in the IC package 102, which can include a lid or some other form of encapsulation of the semiconductor dies thereon.

The processing system 104 may be electrically coupled to the programmable IC 106 through interconnect 112 formed on the substrate 118 or through direct die stacking. As described further below, the processing system 104 can include an interface controller (e.g., a PCIe controller) that is coupled to an interface endpoint (e.g., a PCIe endpoint) in the programmable IC 106 through the interconnect 112. The IC package 102 includes a package interface 108. The package interface 108 can include solder balls, solder bumps, metal pins, or the like. The package interface 108 is configured to interface with a printed circuit board (PCB) or the like in order to electrically and mechanically mount the IC package 102 thereto. The processing system 104 can include circuits coupled to the package interface 108 through interconnects 116 formed on the substrate 118. The programmable IC 106 can include circuits coupled to the package interface 108 through interconnects 114 formed on the substrate 118.

The package interface 108 can be coupled to other circuitry including, for example, random access memory (RAM) 132, non-volatile memory (NVM) 134, peripheral(s) 136, and support circuits 138. The RAM 132 can include dynamic RAM (DRAM) (e.g., double data-rate (DDR) RAM and the like), static RAM (SRAM), or the like. The NVM 134 can include read-only memory (ROM) (e.g., electronically erasable programmable ROM (EEPROM) or the like) and/or non-volatile RAM (NVRAM) (e.g., FLASH memory, solid state storage, and the like). The peripheral(s) 136 can include any type of peripheral circuit used in computing systems that is known in the art. The support circuits 138 can include power supplies and like type circuits for supporting the IC package 102. The RAM 132, the NVM 134, and the peripheral(s) 136 may be referred to as "external" RAM, NVM, and/or peripherals to distinguish these circuits from RAM, NVM, and/or peripherals implemented inside of the IC package 102, as described further herein.

The programmable IC 106 includes peripheral circuitry 110. The peripheral circuitry 110 is configured for communication with the processing system 104 through an interface (e.g., a PCIe interface). The peripheral circuitry 110 includes hardened circuits, programmed circuits, or a combination thereof.

As used herein, "hardened circuits" are manufactured as part of an IC. Unlike programmable logic, hardened circuitry is not formed through configuration of programmable logic in the programmable IC. Hardened circuitry is generally considered to have dedicated circuit blocks and interconnects, for example, which have a particular functionality and are functional without first loading a configuration bitstream into the programmable IC 106. Hardened circuitry can have one or more operational modes that can be set or selected according to parameter settings. The parameter settings can be realized, for example, by storing values in one or more memory elements within the programmable IC 106 (e.g., registers). The operational modes can be set, for example, through the loading of the configuration bitstream into the programmable IC 106. Despite this ability, the hardened circuitry is not considered to be "programmable logic." In contrast to a hardened circuit, a programmed circuit is a circuit that is configured in programmable logic of the programmable IC through the loading of a configuration bitstream.

The IC package 102 includes the peripheral circuitry 110 for use by the processing system 104. Portions of the peripheral circuitry 110 can be programmed circuitry configured in programmable logic of the programmable IC 106, allowing the particular types and numbers of peripherals to change dynamically over time. Examples of the peripheral circuitry 110 are described further below. The peripheral circuitry 110 implements on-chip or internal peripheral(s), as opposed to the peripheral(s) 136 external to the IC package 102.

In an example, the IC package 102 can include one or more other ICs 120. Each IC 120 is implemented on a semiconductor die that is mechanically and electrically coupled to the substrate 118. The other IC(s) 120 can be electrically connected to the processing system 104 through interconnects 126 on the substrate 118 and/or the programmable IC 106 through interconnects 130 on the substrate 118. The other ICs 120 can include circuits coupled to the package interface 108 through interconnects 128 on the substrate 118. In an example, the other ICs 120 can include RAM 122 and/or non-volatile memory (NVM) 124. The RAM 122 can be coupled to the programmable IC 106, the processing system 104, or both the programmable IC 106 and the processing system 104 (e.g., a shared memory). Likewise, the NVM 124 can be coupled to the programmable IC 106, the processing system 104, or both the programmable IC 106 and the processing system 104. The RAM 122 and/or the NVM 124 can be coupled to the package interface 108. The RAM 122 and the NVM 124 can be similar devices as the RAM 132 and the NVM 134, respectively.

In the example above, the processing system 104 and the programmable IC 106 are implemented using two separate semiconductor dies mounted to the substrate 118 within the IC package 102. In an alternative example, the processing system 104 and the programmable IC 106 are implemented using a single semiconductor die disposed within the IC package 102. In such case, the single semiconductor die can be mounted to the substrate 118 or the substrate 118 can be omitted. The other ICs 120 can be implemented on one or more dies separate from the processing system 104 and the programmable IC 106. Alternatively, one or more of the other ICs 120 can be implemented on the same die as the processing system 104 and/or the programmable IC 106.

In operation, the processing system 104 executes software code, which can be stored in the RAM 132 and/or NVM 134. The processing system 104, in response to executing software code, can communicate with the peripheral circuitry 110 in the programmable IC 106. For example, the peripheral circuitry 110 can perform one or more functions in hardware (e.g., hardware accelerator(s)) on behalf of the processing system 104. When power is supplied to the IC package 102, the programmable IC 106 can be configured to implement at least a portion of the peripheral circuitry 110 using configuration data (e.g., a configuration bitstream) stored in the NVM 124 and/or the NVM 134. After initial configuration, the programmable IC 106 can be dynamically reconfigured (e.g., using partial reconfiguration) to change the functionality of all or a portion of the peripheral circuitry 110. In an example, the processing system 104 executes software code to reconfigure the programmable IC 106 (e.g., through a PCIe interface).

Figure 2:
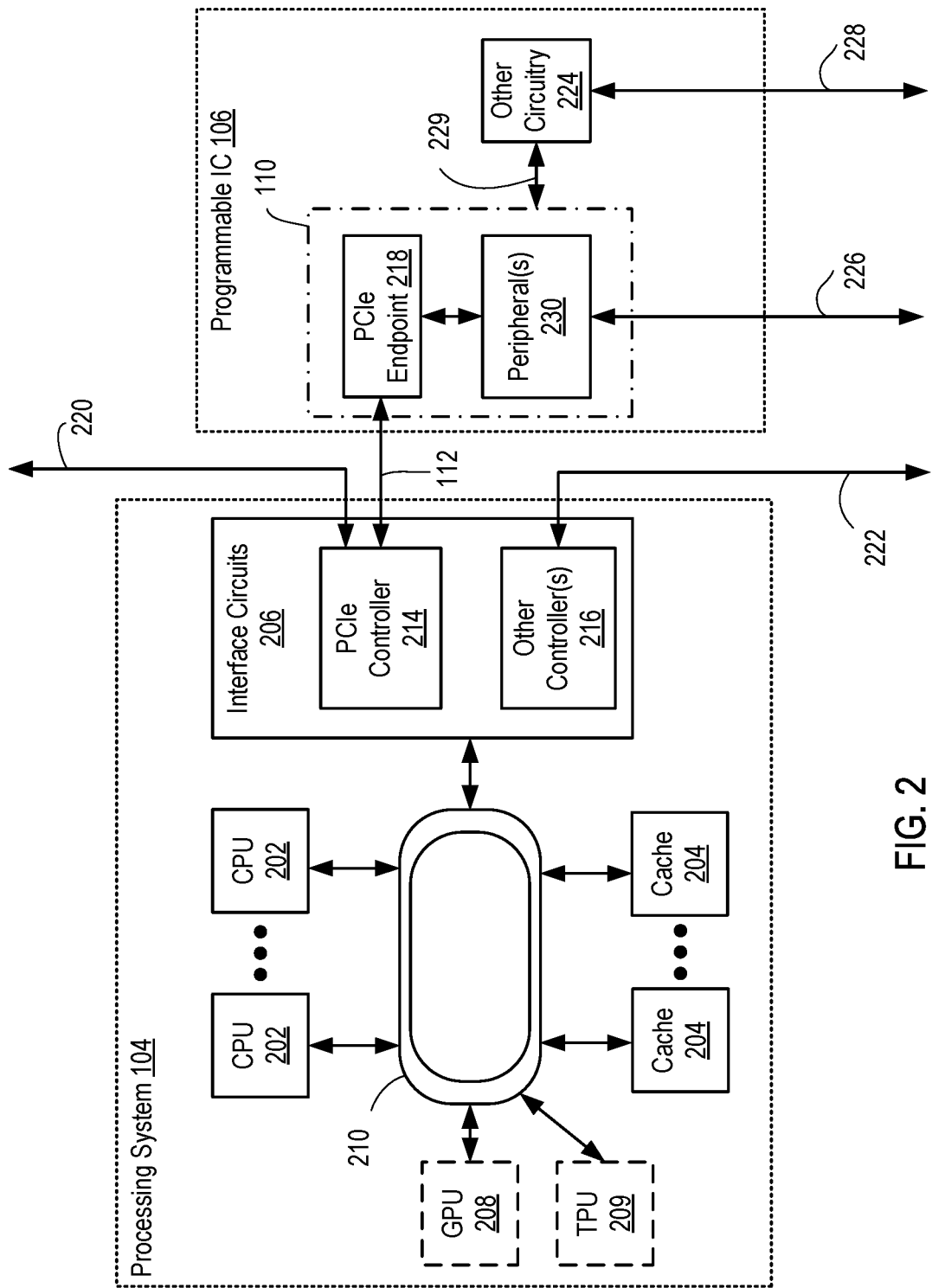
FIG. 2 is a block diagram depicting examples of a processing system and a programmable IC in the IC package of FIG. 1.

FIG. 2 is a block diagram depicting examples of the processing system 104 and the programmable IC 106. The processing system 104 includes one or more CPUs (e.g., a plurality of CPUs 202 are shown), one or more cache memories (e.g., a plurality of cache memories 204 are shown), and interface circuits 206. The CPUs 202 can include one or more cores and associated circuitry (e.g., cache memories, memory management units (MMUs), interrupt controllers, etc.). In examples, the processing system 104 can include additional components, such as a graphics processing unit (GPU) 208, application-specific circuits (e.g., machine-learning circuits), and the like. The CPUs 202, the cache memories, the interface circuits 206, and other components (e.g., GPU 208, Tensor Processing Unit (TPU) 209, etc.) are coupled to a ring interconnect 210. The ring interconnect 210 is an on-die bus between the various components coupled thereto. Each component includes a local interface to the ring interconnect 210. The various components of the processing system 104 can communicate with each other through the ring interconnect 210. The interface circuits 206 provide an off-die interface to the other components coupled to the ring interconnect 210 (e.g., the CPUs 202 and the GPU 208).

In an example, the ring interconnect 210 includes a ring-based topology with interfaces for each connected component. The ring interconnect 210 can be a bi-directional ring that has a data bus of a particular width, with separate lines for request, snoop, and acknowledge. Each of the CPUs 202 is a unique component on the ring interconnect 210. Similarly, the GPU 208 (if present) is a unique component on the ring interconnect 210. The interface circuits 206 can share an interface to the ring interconnect 210, or each interface component in the interface circuits 206 can include its own interface to the ring interconnect 210. The ring interconnect 210 can include various topologies (e.g., ring, star, mesh, etc.).

The cache memories 204 can provide a shared last level cache (LLC) that is connected to the ring interconnect 210. Each CPU 202 can be allocated a slice of the shared LLC cache. The LLC cache implemented by cache memories 204 can also be accessible by other components on the ring interconnect 210 (e.g., the GPU 208).

In an example, the interface circuits 206 include a PCIe controller 214 and one or more other controllers 216. The other controller(s) 216 can include memory controllers, display controllers, and the like, depending on the components coupled to the ring interconnect 210. The CPUs 202 are coupled to the PCIe controller 214 through the ring interconnect 210. The PCIe controller 214 implements a PCIe root complex on behalf of the CPUs 202.

The peripheral circuitry 110 in the programmable IC 106 includes a PCIe endpoint circuit ("PCIe endpoint 218") and one or more peripherals 230. The programmable IC 106 may also include other circuitry 224. The PCIe endpoint 218 is coupled to the PCIe controller 214 through the interconnect 112. The PCIe endpoint 218 implements a switch coupling the peripherals 230 to the PCIe controller 214. In an example, the peripheral(s) 230 are configured in programmable logic of the programmable IC 106 and the PCIe endpoint 218 is a hardened circuit within the programmable IC 106. In other examples, at least a portion of the PCIe endpoint 218 can be configured in programmable logic of the programmable IC 106. In other examples, one or more of the peripheral(s) 230 can be hardened circuits in the programmable IC 106. The other circuitry 224 can include programmed circuitry configured in programmable logic of the programmable IC 106, hardened circuitry within the programmable IC 106, or a combination thereof.

In other examples, each peripheral 230 can include its own PCIe endpoint, rather than including a single PCIe endpoint shared among the peripherals 230 and functioning as a switch in the programmable IC 106. In another example, the programmable IC 106 can include multiple PCIe endpoints, each of which is shared among a group of the peripherals 230.

In examples, the PCIe controller 214 includes an interface 220 coupled to the package interface 108 of the IC package 102. This enables the processing system 104 to communicate with additional peripheral(s) external to the IC package 102 if desired (e.g., the peripherals 136). In some examples, the interface 220 can be omitted and the PCIe controller 214 communicates solely with PCIe endpoint(s) in the programmable IC 106. The other controller(s) 216 include interface(s) 222 coupled to the package interface 108 of the IC package 102 and/or the other ICs 120. The interfaces 220 and 222 can be implemented using the interconnect 116 between the processing system 104 and the package interface 108. For example, the other controller(s) 216 can include a memory controller for controlling access to the RAM 132 and/or the RAM 122. The other controller(s) 216 can include circuitry for reading and writing to the NVM 134 and/or the NVM 124.

In an example, the other circuitry 224 includes an interface 228. The interface 228 can be coupled to the package interface 108 of the IC package 102, can be coupled to the other ICs 120 (e.g., the NVM 124 shown in FIG. 1), or a combination thereof. In examples, the peripheral circuitry 110 includes an interface 226 coupled to the package interface 108 of the IC package 102, coupled to the other ICs 120 (e.g., the RAM 122 shown in FIG. 1), or a combination thereof. This enables circuits external to the programmable IC 106 to communicate directly with the peripheral circuitry 110. In some examples, the interface 226 can be omitted. The interfaces 226 and 228 can be implemented using the interconnect 114 between the programmable IC 106 and the package interface 108 and/or the interconnect 130 between the programmable IC 106 and the other ICs 120. In an example, the peripheral circuitry 110 includes an interface 229 to the other circuitry 224. The interface 229 can be implemented using dedicated and/or programmable interconnect in the programmable IC 106.

In the example shown, the peripheral circuitry 110 in the programmable IC 106 is coupled to the ring interconnect 210 and the components thereon through a PCIe interface implemented by the PCIe controller 214 and the PCIe endpoint 218. Other types of interfaces can be employed. For example, the PCIe controller 214 and the PCIe endpoint 218 can be replaced with a quick path interconnect (QPI) controller and QPI endpoint. In another example, the PCIe controller 214 and the PCIe endpoint 218 can be replaced with a custom interface controller and custom interface endpoint that is designed specifically to support communication between the processing system 104 and the programmable IC 106. Those skilled in the art will appreciate that various kinds of interfaces can be employed to enable communication between the peripheral circuitry 110 in the programmable IC 106 and components in the processing system 104 on the ring interconnect 210.

Figure 3:
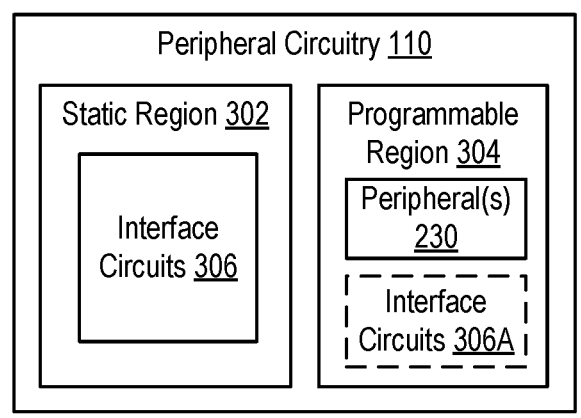
FIG. 3 is a block diagram depicting peripheral circuitry in a programmable IC according to an example.

FIG. 3 is a block diagram depicting the peripheral circuitry 110 according to an example. The peripheral circuitry 110 generally includes a static region 302 and a programmable region 304. The static region 302 includes interface circuits 306 (e.g., PCIe endpoint 218 shown in FIG. 2). The programmable region 304 can include the peripheral(s) 230. In some examples, the programmable region 304 also includes some interface circuits 306A. In some examples, the peripheral circuitry 110 can include more than one programmable region 304, each of which can be individually configured with peripheral(s) 230.

The static region 302 is "static" in that the circuitry thereof remains constant across reconfigurations of the programmable region 304. In an example, the interface circuits 306 include PCIe endpoint circuits, a direct memory access (DMA) controller, interconnects, a memory controller, a memory interface circuit (e.g., a DDR interface), decoupler circuits (to support partial reconfiguration), flash programmer, debug circuits, and the like. In some examples, the programmable region 304 does not include any of the interface circuits 306. In other examples, some of the interface circuits described above (e.g., DMA controller) can be implemented in the programmable region 304 (as interface circuits 306A).

Figure 4:
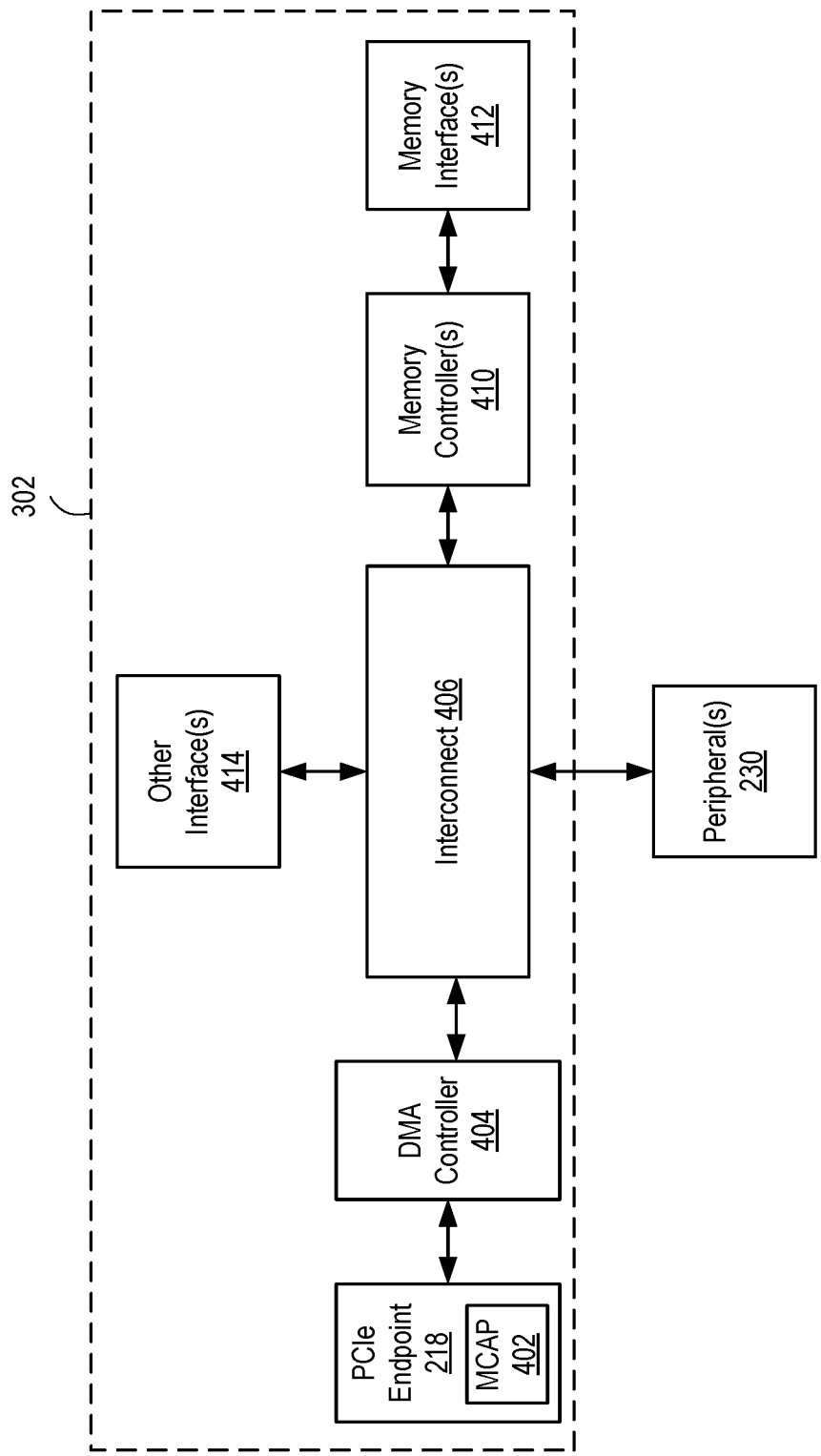
FIG. 4 is a block diagram depicting the peripheral circuitry of FIG. 3 in more detail according to an example.

FIG. 4 is a block diagram depicting the peripheral circuitry 110 in more detail according to an example. The peripheral circuitry 110 includes the interface circuits 306 and the peripheral(s) 230. In the example, the interface circuits 306 include the PCIe endpoint 218, a DMA controller 404, interconnect circuits ("interconnect 406"), memory controller(s) 410, memory interface(s) 412, other interface(s) 414. The interface circuits 306 can include other circuits, which are omitted for clarity (e.g., decoupler circuits, debug circuits, etc). The PCIe endpoint 218 provides a physical interface to a peripheral bus (e.g., to the PCIe controller 214). The PCIe endpoint 218 can include a media configuration access port (MCAP) 402 for controlling reconfiguration of the programmable logic implementing the peripheral(s) 230. The DMA controller 404 facilitates DMA operations between the processing system 104 and the peripheral circuitry 110.

The interconnect 406 couples the DMA controller 404, the peripheral(s) 230, the memory controller(s) 410, and the other interface(s) 414. The memory controller(s) 410 is/are coupled to the memory interface(s) 412. The memory interface(s) 412 can be coupled to RAM external to the programmable IC 106 (e.g., the RAM 122 and/or the RAM 132), to RAM internal to the programmable IC 106 (examples described below), or a combination thereof. The other interface(s) 414 can be coupled to the other circuitry 224 in the programmable IC 106 (e.g., other hardened circuits and/or programmed circuits).

In examples, the interconnect 406 is implemented using an Advanced Extensible Interface (AXI) interconnect defined as part of an ARM® Advanced Microcontroller Bus Architecture (AMBA®) standard. For example, the interconnect 406 can support AXI4, AXI4-Lite, and AXI4-Stream protocols. The AXI4 protocol defines a high-performance, memory-mapped interface. The AXI4-Lite protocol defines a low-throughput, memory-mapped interface. The AXI4-Stream protocol defines a high-speed streaming interface. The AXI specifications define an interface between a single AXI master and a single AXI slave. The interconnect 406 couples AXI masters to AXI slaves. The AXI4 and AXI4-Lite interfaces include five different channels (i.e., read and write address channels, read and write data channels, and a write response channel). The AXI4-Stream protocol defines a single channel for transmission of streaming data between master and slave. In memory-mapped AXI (e.g., AXI4 or AXI4-Lite), all transactions involve a target address within a memory space and the data to be transferred. In streaming AXI (e.g., AXI-Stream), the concept of an address is not present or required. Each of the DMA controller 404, the peripheral(s) 230, the other interface(s) 414, and the memory controller(s) 410 include one or more AXI masters and one or more AXI slaves for communication among each other.

In operation, the processing system 104 accesses the peripheral circuitry 110 through the PCIe endpoint 218. The processing system 104 can move data to, and receive data from, the peripheral circuitry 110 using DMA transactions handled by the DMA controller 404. The processing system 104 can move data directly to, and receive data directly from, the peripheral(s) 230. The processing system 104 can also move data to, and receive data from, the memory controller(s) 410. For example, rather than sending and receiving data directly from the peripheral(s) 230, the processing system 104 can move data to the memory controller(s) 410 for storage in RAM using DMA transactions. The peripheral(s) 230 can access and process the data stored in the RAM. The processing system 104 can then retrieve processed data from the RAM using DMA transactions. In other examples, one or more of the memory controller(s) 410 are not accessible by the processing system 104 and are private to the peripheral(s) 230.

The processing system 104 can also move data directly to, and receive data directly from, the other interface(s) 414. Alternatively, rather than sending and receiving data directly from the other interface(s) 414, the processing system 104 can move data to the memory controller(s) 410 for storage in RAM using DMA transactions. The other interface(s) 414 can access and process the data stored in the RAM. The processing system 104 can then retrieve processed data from the RAM using DMA transactions. In other examples, one or more of the other interface(s) 414 are not accessible by the processing system 104 and are private to the peripheral(s) 230.

Figure 5:
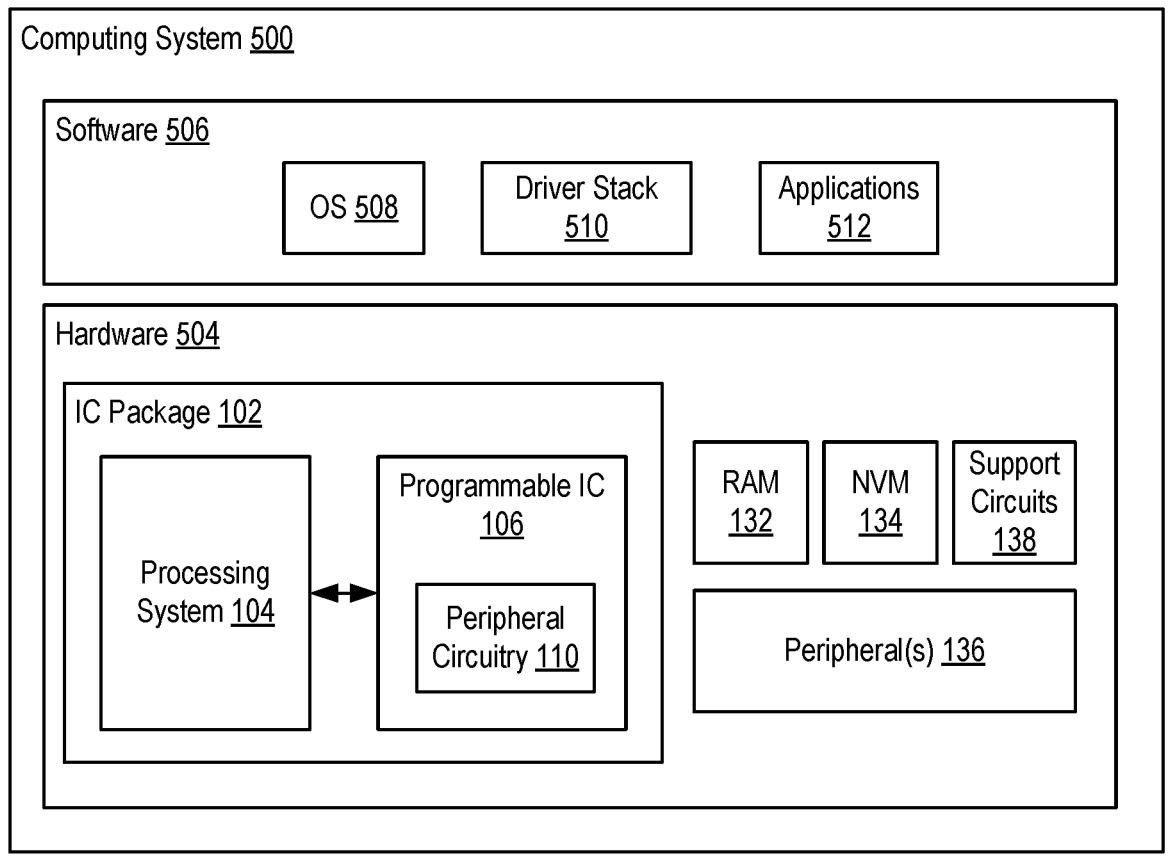
FIG. 5 is a block diagram depicting a computing system according to an example.

FIG. 5 is a block diagram depicting a computing system 500 according to an example. The computing system 500 includes hardware 504 and software 506 executing on the hardware 504. The hardware 504 includes the IC package 102 having at least the processing system 104 and the programmable IC 106 (the other IC(s) 120 are omitted from FIG. 5 for clarity). The hardware 504 also includes the circuitry coupled to the IC package 102, such as the RAM 132, the NVM 134, the support circuits 138, and the peripheral(s) 136. The software 506 includes an operating system (OS) 508, a driver stack 510, and applications 512. The processing system 104 is configured to execute the software 506 to perform one or more operations described herein and which can be stored in the RAM 132 or other storage device. In an embodiment, IC package 102 can include FIFO buffers disposed between the processing system 104 and the programmable IC 106 (e.g., the FIFO buffers can be disposed in either or both the processing system 104 and/or the programmable IC 106).

The OS 508 can be any commodity operating system known in the art, such as such as Linux®, Microsoft Windows®, Mac OS®, or the like. The driver stack 510 includes drivers and libraries that provide application programming interfaces (APIs) to the peripheral circuitry 110 for command and control thereof. The applications 512 include software that invokes the peripheral circuitry 110 through the driver stack 510 to perform some work. The applications 512 can include neural network, video processing, network processing, or the like type applications that offload some functions from the processing system 104 to the peripheral circuitry 110. The applications 512 can also control configuration of the programmable IC 106 to change the functionality of the peripheral circuitry 110.

The driver stack 510 can include various libraries, drivers, and the like, such as a DMA driver, hardware abstraction layer (HAL) driver, and runtime library. The runtime library provides an API for use by the applications 512. The runtime library provides an interface between the applications 512 and the HAL driver. The HAL driver likewise includes an API for use by the runtime library. The HAL driver provides an interface between the runtime library and the DMA driver. The DMA driver includes an API for controlling the peripheral circuitry 110. In particular, the DMA driver includes API(s) for accessing the peripheral(s) 230, the memory controller(s) 410, and/or the other interface(s) 414 through the DMA controller 404.

Figure 6:
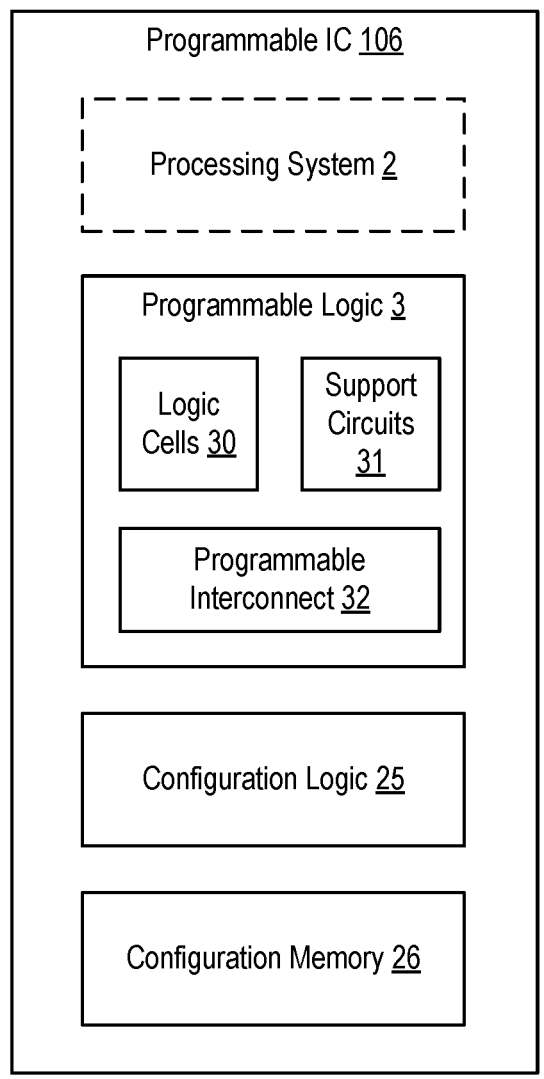
FIG. 6 is a block diagram depicting a programmable IC according to an example.

FIG. 6 is a block diagram depicting the programmable IC 106 according to an example. The programmable IC 106 includes programmable logic 3, configuration logic 25, and configuration memory 26. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The support circuits 31 can include FIFO buffers for input to and output from the logic cells 30. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 106 includes a processing system 2. The processing system 2 can include microprocessor(s), memory, support circuits, IO circuits, and the like. The processing system 2 may be referred to as an "embedded" processing system to distinguish it from the processing system 104 in the IC package 102.

Figure 7:
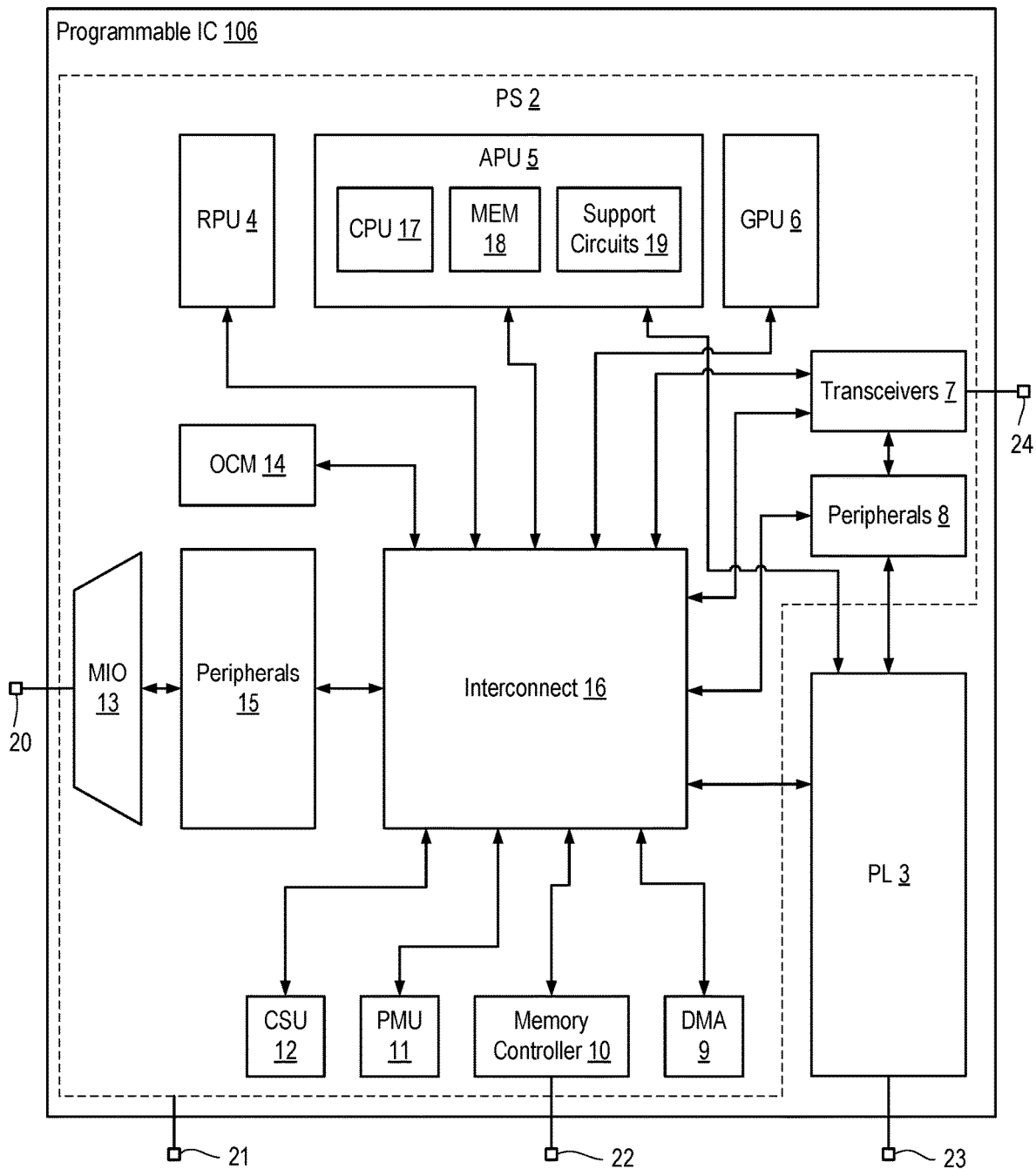
FIG. 7 is a block diagram depicting a System-on-Chip (SoC) implementation of a programmable IC according to an example.

FIG. 7 is a block diagram depicting a System-on-Chip (SoC) implementation of the programmable IC 106 according to an example. In the example, the programmable IC 106 includes the processing system 2 and the programmable logic 3. The processing system 2 includes various processing units, such as a real-time processing unit (RPU) 4, an application processing unit (APU) 5, a graphics processing unit (GPU) 6, a configuration and security unit (CSU) 12, a platform management unit (PMU) 122, and the like. The processing system 2 also includes various support circuits, such as on-chip memory (OCM) 14, transceivers 7, peripherals 8, interconnect 16, DMA circuit 9, memory controller 10, peripherals 15, and multiplexed IO (MIO) circuit 13. The processing units and the support circuits are interconnected by the interconnect 16. The PL 3 is also coupled to the interconnect 16. The transceivers 7 are coupled to external pins 24. The PL 3 is coupled to external pins 23. The memory controller 10 is coupled to external pins 22. The MIO 13 is coupled to external pins 20. The PS 2 is generally coupled to external pins 21. The APU 5 can include a CPU 17, memory 18, and support circuits 19.

In the example of FIG. 7, the peripheral circuitry 110 can programmed circuits, hardened circuits, or a combination thereof disposed in the PL 3. In another example, some portion of the peripheral circuitry 110 can be implemented using the PS 2. In another example, the PS 2 can be accessible through the other interface(s) 414 of the peripheral circuitry 110. In such an example, the processing system 104 and/or peripheral(s) 230 can access the PS 2.

Referring to the PS 2, each of the processing units includes one or more CPUs and associated circuits, such as memories, interrupt controllers, DMA controllers, memory management units (MMUs), floating point units (FPUs), and the like. The interconnect 16 includes various switches, busses, communication links, and the like configured to interconnect the processing units, as well as interconnect the other components in the PS 2 to the processing units.

The OCM 14 includes one or more RAM modules, which can be distributed throughout the PS 2. For example, the OCM 14 can include battery backed RAM (BBRAM), tightly coupled memory (TCM), and the like. The memory controller 10 can include a DRAM interface for accessing external DRAM. The peripherals 8, 15 can include one or more components that provide an interface to the PS 2. For example, the peripherals 136 can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose IO (GPIO) ports, serial advanced technology attachment (SATA) ports, PCIe ports, and the like. The peripherals 15 can be coupled to the MIO 13. The peripherals 8 can be coupled to the transceivers 7. The transceivers 7 can include serializer/deserializer (SERDES) circuits, MGTs, and the like.

Figure 8:
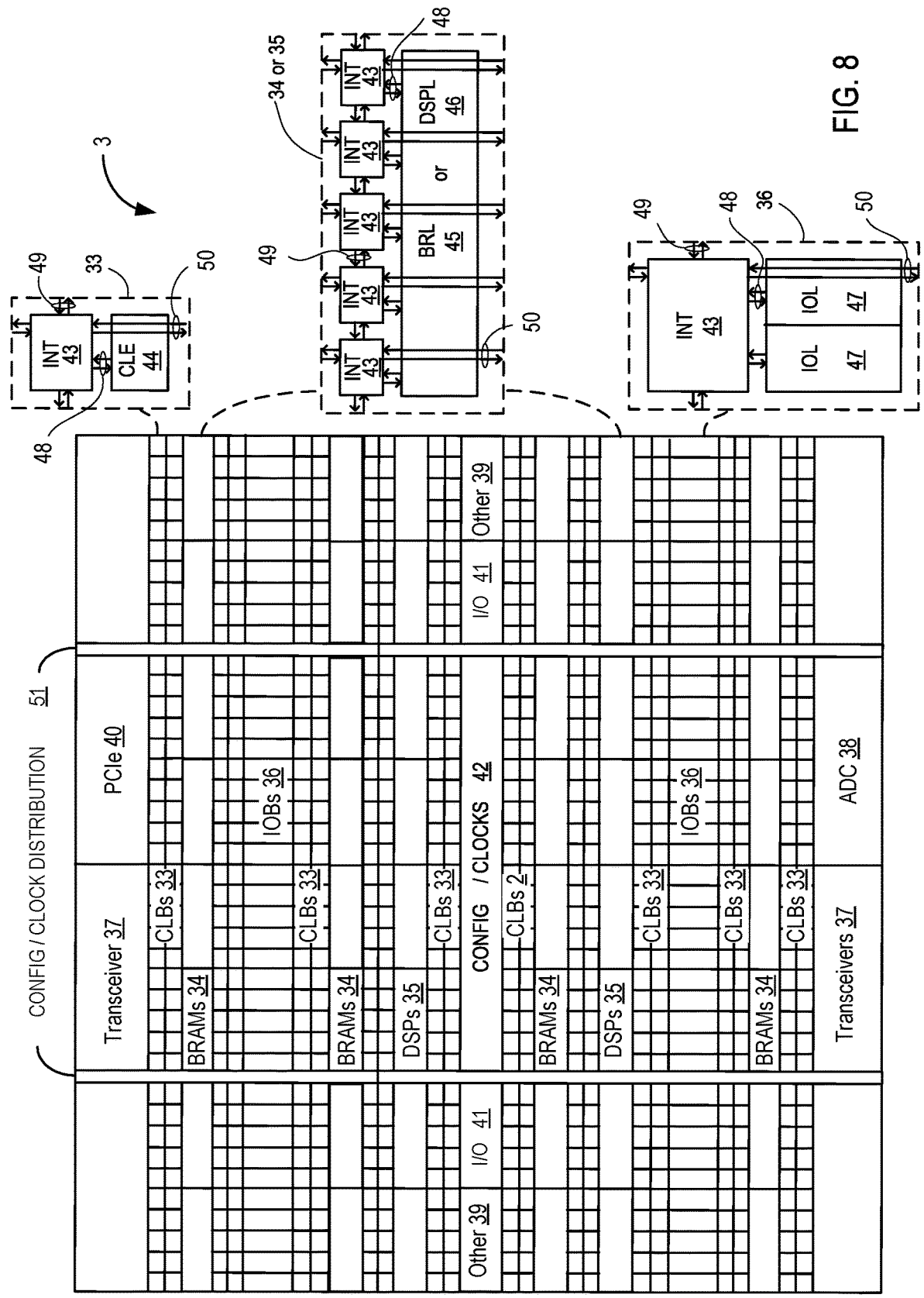
FIG. 8 illustrates a field programmable gate array (FPGA) implementation of a programmable IC.

FIG. 8 illustrates a field programmable gate array (FPGA) implementation of the programmable IC 106. The PL 3 in the SoC implementation of the programmable IC 106 shown in FIG. 7 can also have the structure shown in FIG. 8. The FPGA implementation includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 8. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An 10B 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 8) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 9:
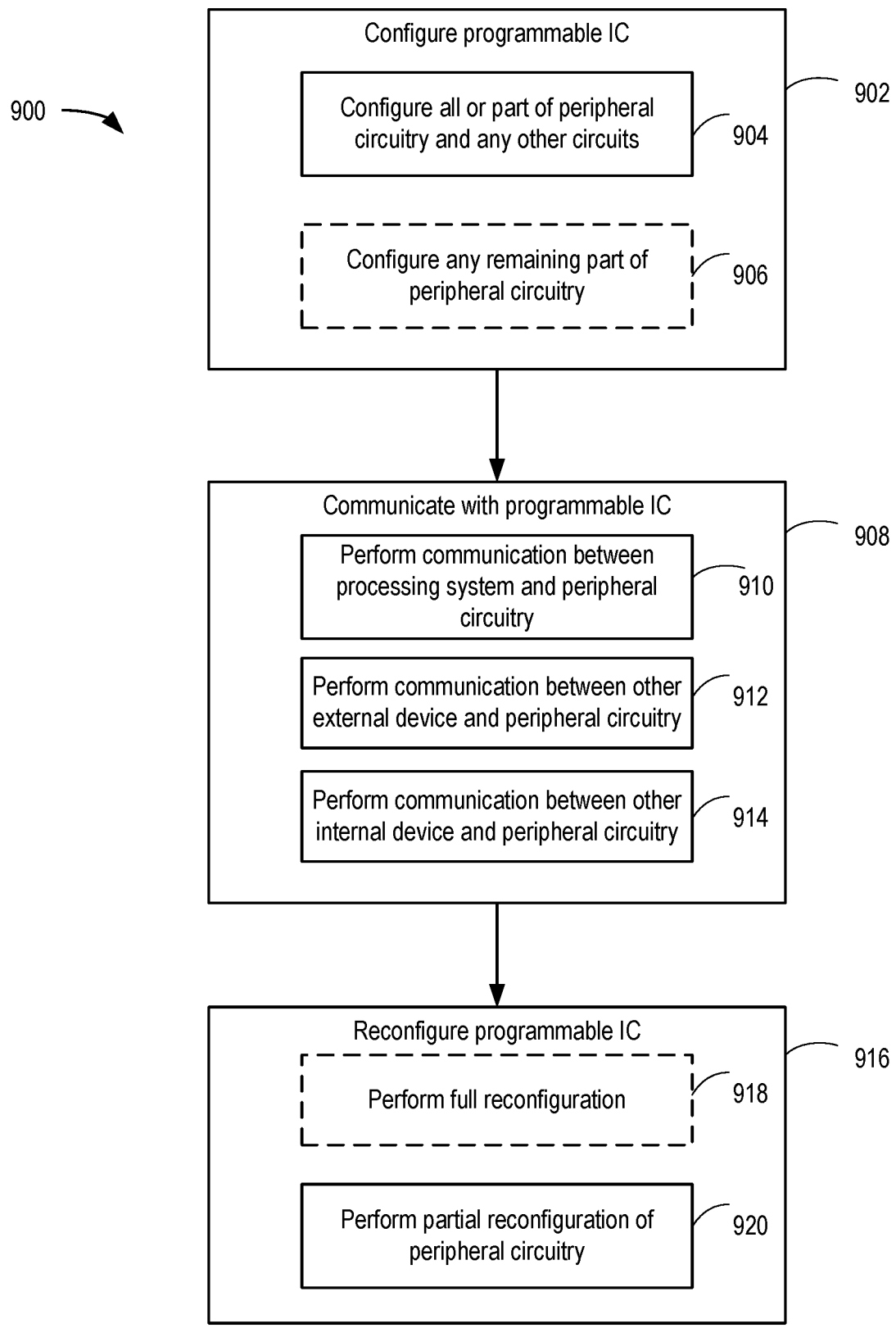
FIG. 9 is a flow diagram depicting a method of operating a programmable IC in an IC package according to an example.

FIG. 9 is a flow diagram depicting a method 900 of operating the programmable IC 106 in the IC package 102 according to an example. Aspects of the method 900 can be understood with reference to FIGS. 1-8 above. The method 900 includes three main phases: At block 902, the programmable IC 106 is configured upon power-up of the IC package 102. A block 908, device(s) communicate with the programmable IC 106. At block 916, the programmable IC 106 is reconfigured during power-on of the IC package 102. There are various use cases for each of the three main phases of operating the programmable IC 106.

At power-on of the IC package 102, there are several different processes that can be used to configure the programmable IC 106. The configuration logic 25 of the programmable IC 106 includes a number of different configuration modes, which can be categorized into master modes and slave modes. In master modes, the configuration logic 25 drives the configuration process. Example master modes include master serial peripheral interface (SPI) mode, master byte peripheral interface (BPI) mode, master serial mode, and master SelectMAP mode. In the master SPI mode, the configuration logic 25 loads a configuration bitstream from NVM using an SPI protocol. The NVM can be internal to the IC package 102 (e.g., the NVM 124) or external to the IC package 102 (e.g., the NVM 134). The master BPI mode operates similarly, but using a BPI protocol in place of the SPI protocol. The master serial operates similarly, but using a serial protocol. The master SelectMAP mode operates similarly, but uses a parallel interface rather than a serial interface. In the slave modes, an external device drives the configuration process. Example slave modes include slave serial and slave SelectMAP modes (parallel). In either of these slave modes, the external device can be the processing system 104 or some other microprocessor or microcontroller (e.g., either part of the other ICs 120 in the IC package 102 or the support circuits 138 external to the IC package 102). The external device reads the configuration data from memory (e.g., the NVM 124 or the NVM 134) and supplies the configuration data to the configuration logic 25.

At block 904, at least a portion of the peripheral circuitry 110 is configured in the programmable IC 106. If any other circuitry 224 is present, all or a portion of such other circuitry 224 can also be configured in block 904. For example, the static region 302 of the peripheral circuitry 110 can be configured in block 904. Any of the master or slave modes can be used for configuration of the programmable IC 106 in block 904. Configuration in block 904 is typically hardware-driven, i.e., power is applied to the IC package 102 and the configuration process is performed by either the configuration logic 25 (master mode) or by an external device (slave mode).

In some cases, only a portion of the peripheral circuitry 110 is configured at block 904 (e.g., the static region 302). In such case, a remaining portion of the peripheral circuitry 110 can be configured at block 906. Configuration in block 906 can be either hardware-driven as described above or software-driven. In a software-driven process, for example, the programmable IC 106 can be partially reconfigured to implement the peripheral(s) 230 through the MCAP 402 using the processing system 104.

At block 908, communication with the programmable IC 106 can be divided into three general categories: At block 910, communication is performed between the processing system 104 and the peripheral circuitry 110. At block 912, communication is performed between an external device (external to the programmable IC 106) and the peripheral circuitry 110. At block 914, communication is performed between an internal device (inside the programmable IC 106) and the peripheral circuitry 110.

In block 910, the processing system 104 sends data to, and/or receives data from, the peripheral circuitry 110 over an interface, such as PCIe or the like. The processing system 104 can use DMA transactions to transfer data to and from the peripheral circuitry 110 over the interface. Alternatively, the processing system 104 can stream data to the peripheral circuitry 110 over the interface. In some cases, the processing system 104 can indirectly provide data to and from the peripheral circuitry 110 through a shared memory, which can be disposed either inside the programmable IC 106 or external to the programmable IC 106.

In block 912, a device external to the programmable IC 106 communicates with the peripheral circuitry 110. For example, a circuit in the other ICs 120, in the support circuits 138, or in the peripherals 136 can communicate directly with the peripheral circuitry 110. Alternatively, such a circuit can communicate indirectly with the peripheral circuitry 110 through a shared memory, which can be disposed either inside the programmable IC 106 or external to the programmable IC 106.

In block 914, a device internal to the programmable IC 106 communicates with the peripheral circuitry 110. For example, a circuit in the other circuitry 224 can communicate directly with the peripheral circuitry 110. Alternatively, such a circuit can communicate indirectly with the peripheral circuitry 110 through a shared memory, which can be disposed inside the programmable IC 106 or external to the programmable IC 106. Such a circuit can be a programmed circuit in the programmable logic of the programmable IC 106 or a hardened circuit in the programmable IC 106 (e.g., an embedded processing system).

In block 916, the programmable IC 106 can be reconfigured while power is applied to the IC package 102. For example, at block 918, the programmable IC 106 can be reconfigured completely using similar processes as described in block 902. Alternatively, at block 920, the programmable IC 106 can be partially reconfigured. For example, one or more peripheral(s) 230 of the peripheral circuitry 110 can be reconfigured to implement different functionality.

Figure 10:
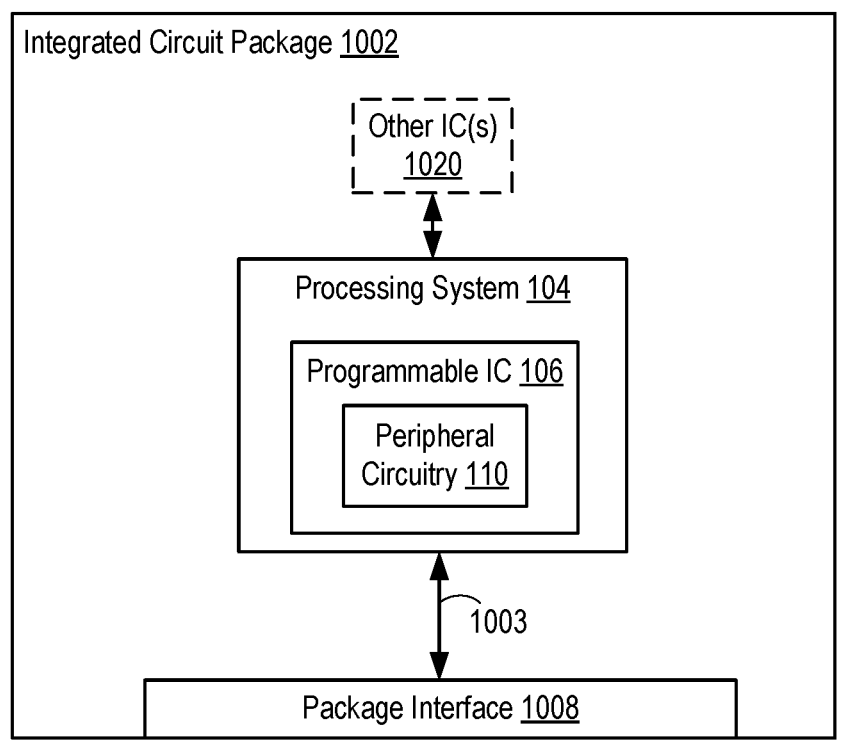
FIG. 10 is a block diagram depicting an IC package according to another example.

FIG. 10 is a block diagram depicting an IC package 1002 according to another example. In the present example, the IC package 1002 includes the processing system 104 and the programmable IC 106 formed on a single semiconductor die. The programmable IC 106 includes the peripheral circuitry 110, as described above. The programmable IC 106 is coupled to other components in the processing system 104 through one or more ring interconnects, as described in examples below. The processing system 104 is coupled to a package interface 1008 through interconnect 1003 in the IC package 1002. In examples, the IC package 1002 can include one or more other ICs 1020 that are coupled to the processing system 104. Thus, the present example differs from that in FIG. 1 in that the programmable IC 106 is coupled to internal ring interconnect within the processing system 104, rather than through an interface such as PCIe, QPI, or the like.

Figure 11:
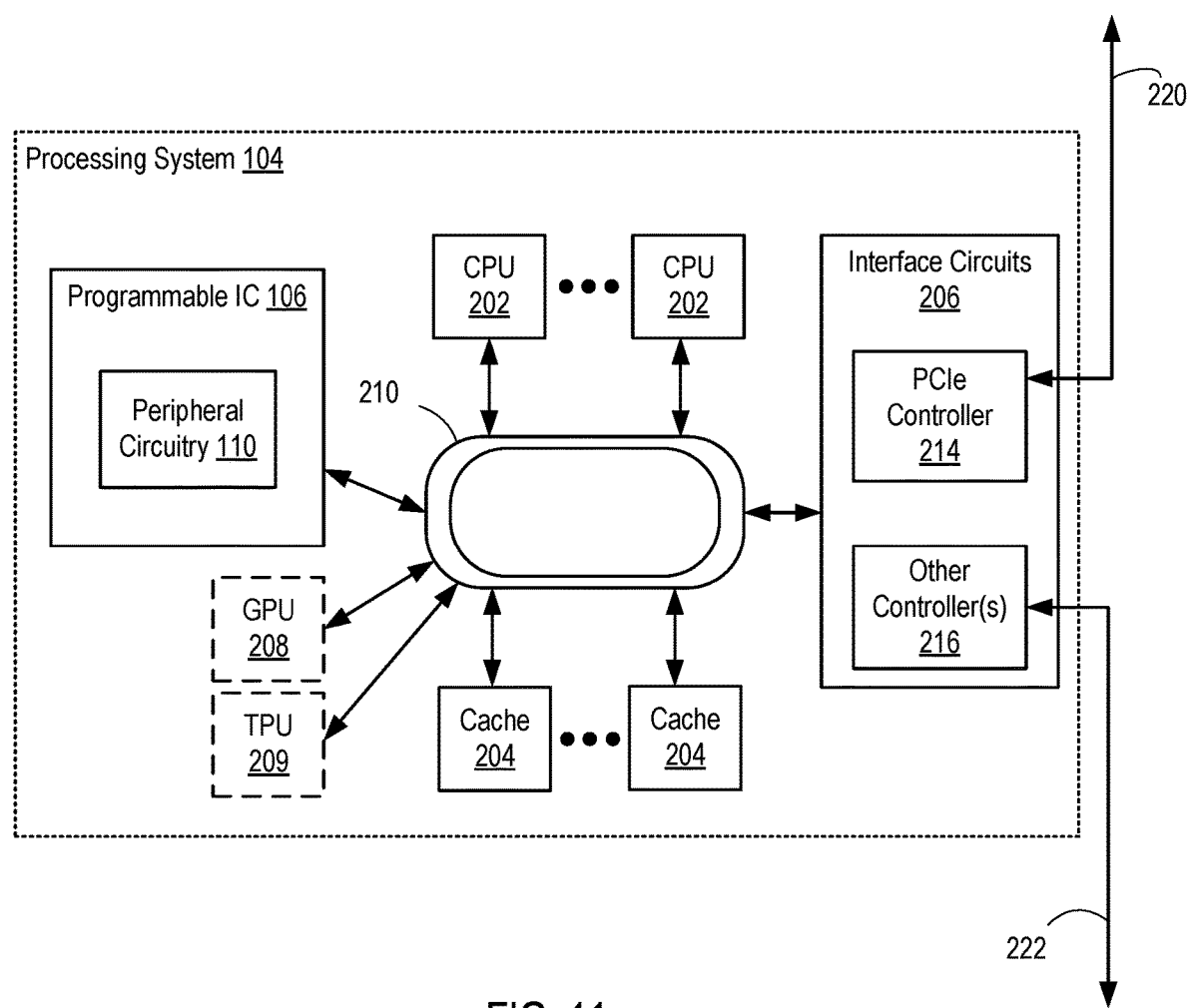
FIG. 11 is a block diagram depicting an example implementation of the processing system in the IC package of FIG. 10.

FIG. 11 is a block diagram depicting an example implementation of the processing system 104 in the IC package 1002. In the present example, the processing system 104 includes the CPUs 202, the cache memories 204, and the interface circuits 206, each coupled to the ring interconnect 210, as described in the examples above. Particular to this example, the programmable IC 106 is also coupled to the ring interconnect 210. The peripheral circuitry 110 can be implemented as hardened circuits in the programmable IC 106, as programmed circuits in the programmable logic of the programmable IC 106, or a combination thereof. The interface circuits 206 include the PCIe controller 214 and the other controllers 216, as described above. Alternatively, the PCIe controller 214 can be replaced with any other similar interface controller (e.g., QPI controller). In examples, the processing system 104 can include other component(s) coupled to the ring interconnect 210, such as the GPU 208.

In the present example, the programmable IC 106 can communicate with any other component in the processing system 104 that is coupled to the ring interconnect 210 (e.g., the CPUs 202, cache memories 204, interface circuits 206, GPU 208, etc). The programmable IC 106 can be accessed by circuits external to the processing system 104 through the interface circuits 206.

Figure 12:
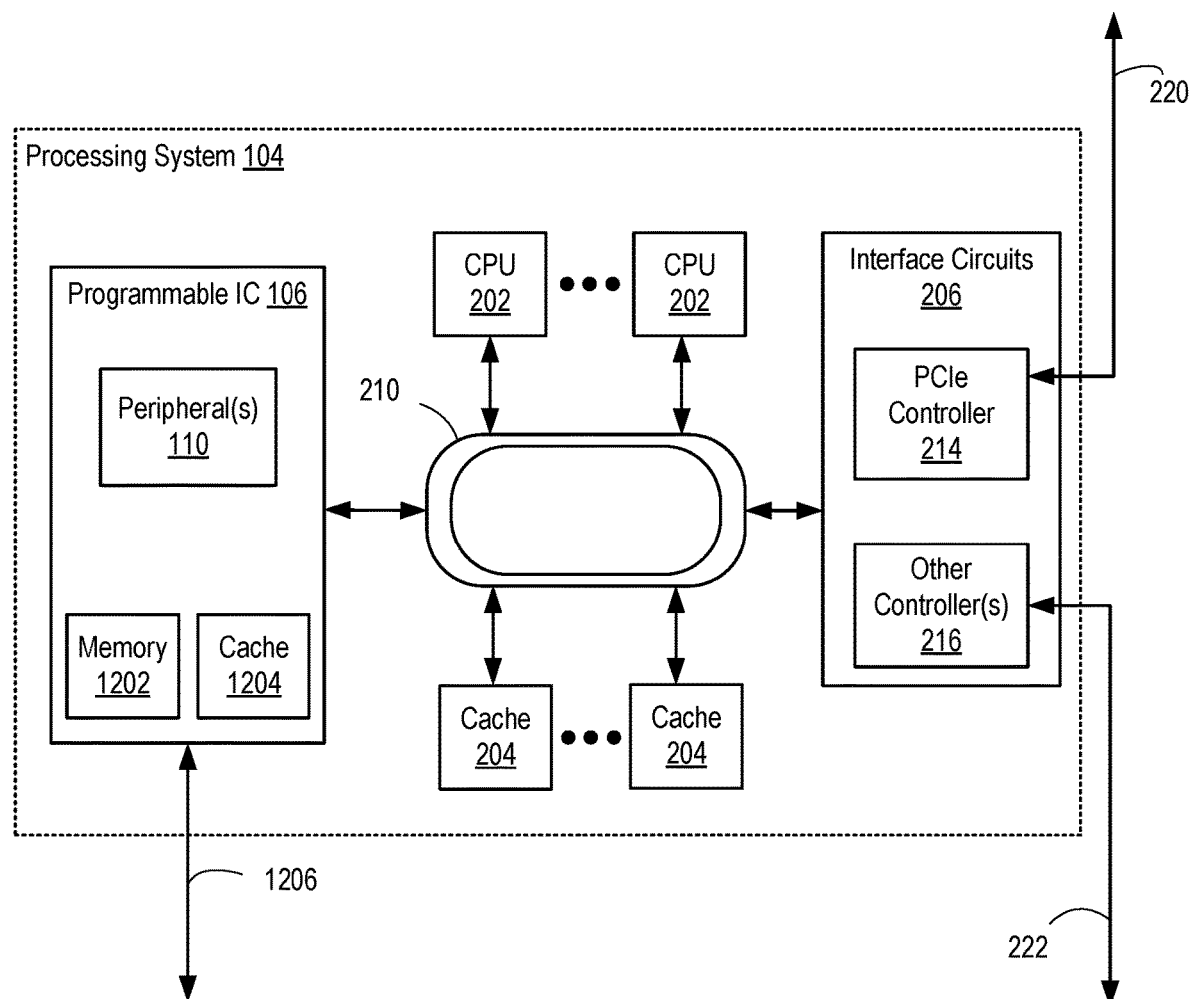
FIG. 12 is a block diagram depicting yet another example implementation of the processing system in the IC package of FIG. 10.

FIG. 12 is a block diagram depicting another example implementation of the processing system 104 in the IC package 1002. In the present example, the programmable IC 106 is coupled to the ring interconnect 210 as described above in the example of FIG. 11. In an example, the programmable IC 106 includes private memory, such as memory 1202 (e.g., random access memory (RAM)) and/or cache 1204. The private memory 1202, 1204 is not accessible directly through the ring interconnect 210. In another example, the memory 1202, 1204 in the programmable IC 106 can be coupled to the ring interconnect 210 and accessed by other components on the ring interconnect 210. In either case, the programmable IC 106 can further include an external interface 1206 for access by circuits external to the processing system 104. This enables the programmable IC 106 to be accessed directly through the external interface 1206, rather than only through the interface circuits 206. For example, the external interface 1206 can include a configuration interface for configuring the programmable IC 106. The external interface 1206 can employ any type of interface, such as PCIe, QPI, or the like. For purposes of clarity, the optional GPU 208 is omitted, but can be included in the processing system 104 shown in FIG. 11.

Figure 13:
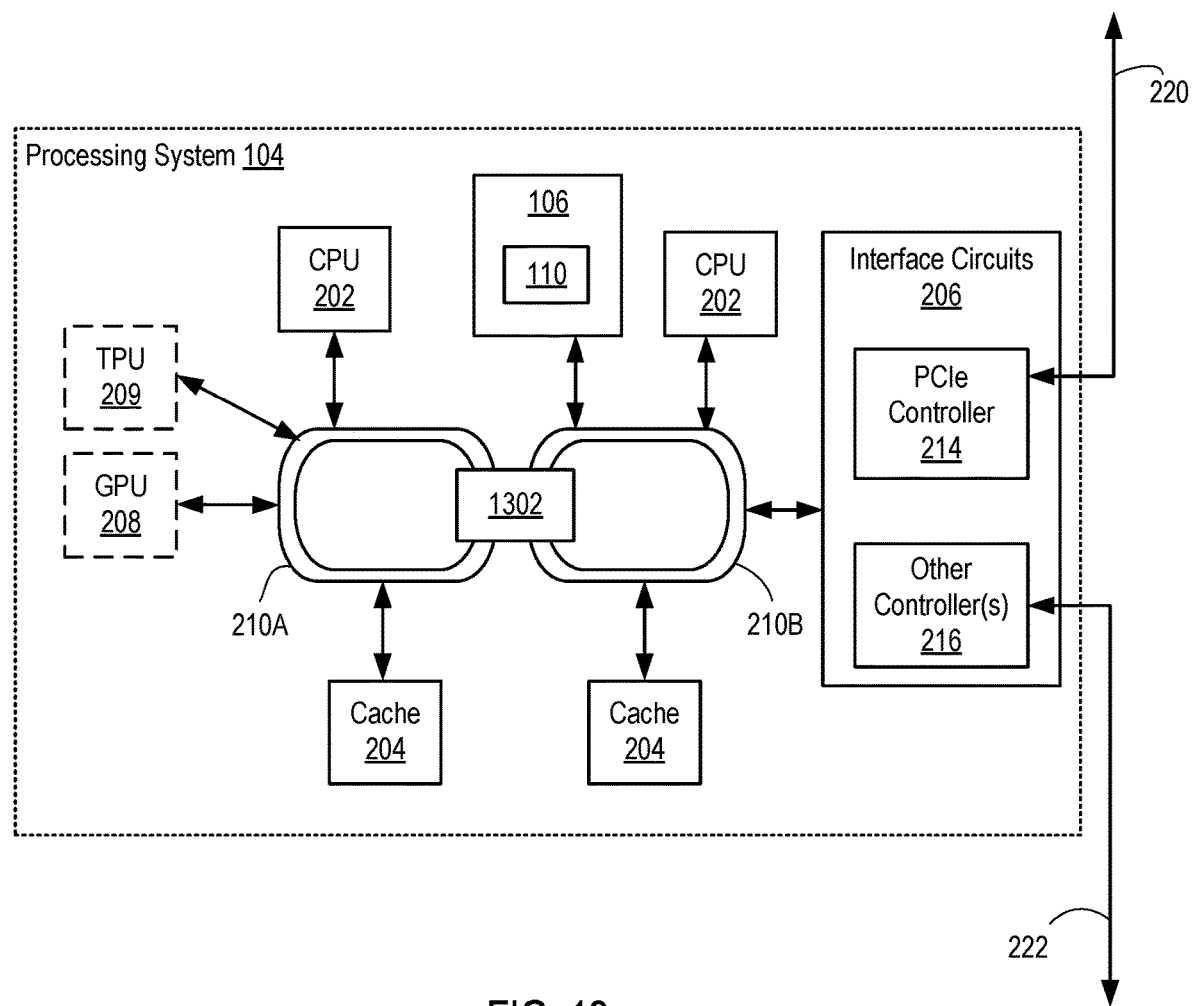
FIG. 13 is a block diagram depicting yet another example implementation of the processing system in the IC package of FIG. 10.

FIG. 13 is a block diagram depicting yet another example implementation of the processing system 104 in the IC package 1002. In the present example, the processing system 104 includes two sub-rings 210A and 210B coupled by a ring-to-ring connector 1302. The ring-to-ring connector 1302 can be a router, bridge, or the like. The programmable IC 106 is coupled to the sub-ring 210B along with a CPU 202, a cache memory 204, and the interface circuits 206. A CPU 202 and a cache memory 204 is coupled to the sub-ring 210A. In an example, other components can be coupled to the sub-ring 210A and/or 201B. For example, the GPU 208 can be coupled to the sub-ring 210A. With the exception of the sub-rings 210A, 210B, the configuration shown in FIG. 13 is similar to that of FIG. 11. The present configuration can support a programmable IC 106 having a large enough bandwidth where it would be beneficial for the ring interconnect 210 to be divided into sub-rings.

When combining a processing system with a programmable IC, communication between the two using a streaming interface is a superior mode of communication in various applications, such as real-time data processing. The alternative is direct memory addressing, which is the dominant communication paradigm. In examples, the interconnection between the processing system 104 and the programmable IC 106 can support a streaming mode in addition to a memory addressing mode.

Figure 14:
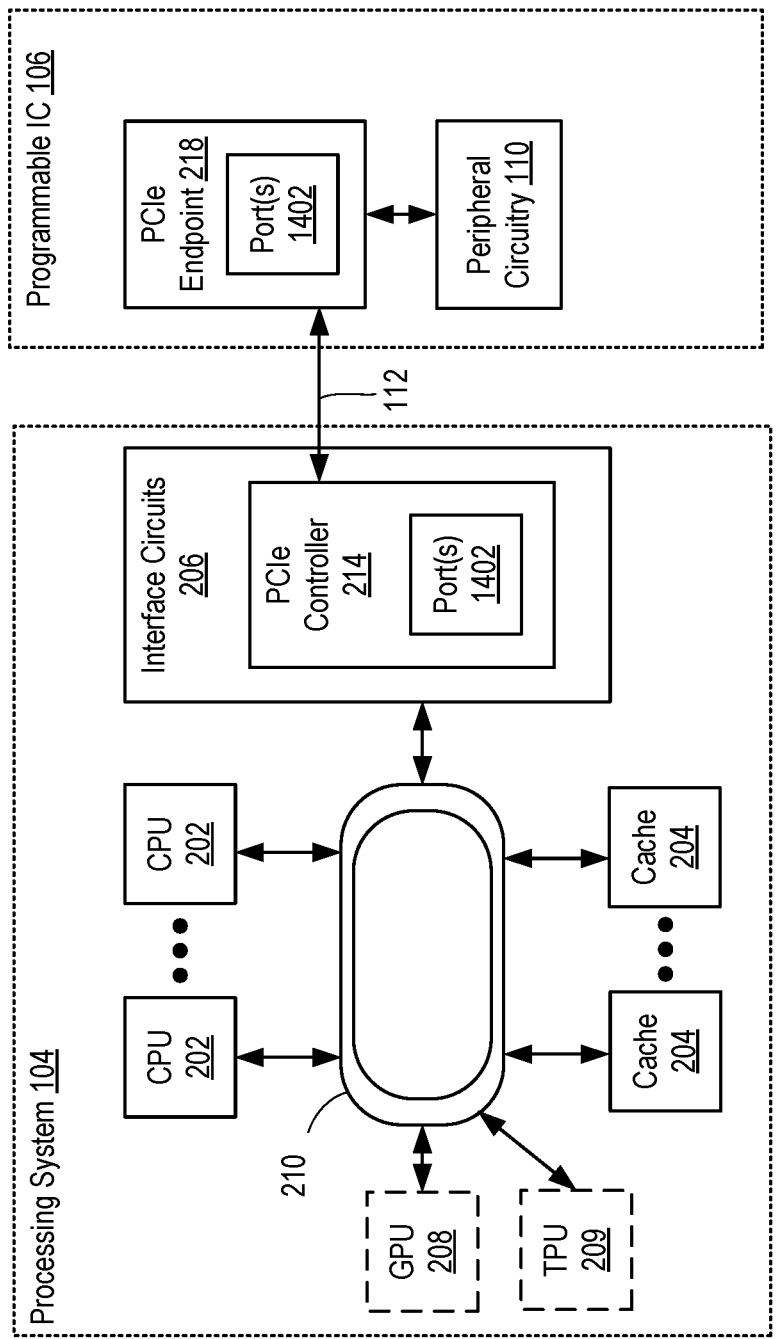
FIG. 14 is a block diagram depicting an example implementation of the IC package of FIG. 1 configured for communication using streaming interfaces.

FIG. 14 is a block diagram depicting an example implementation of the IC package 102 configured for communication using streaming interfaces. In the example, each of the PCIe controller 214 and the PCIe endpoint 218 include one or more ports 1402. In one mode, the port(s) 1402 can be configured to communicate using memory addressing. In another mode, the port(s) 1402 can be configured to communicate using a streaming interface. An example streaming interface is the AMBA® AXI4 streaming interface, although other streaming interfaces can be used. In examples, the port(s) 1402 can support more than one streaming interface.

Figure 15:
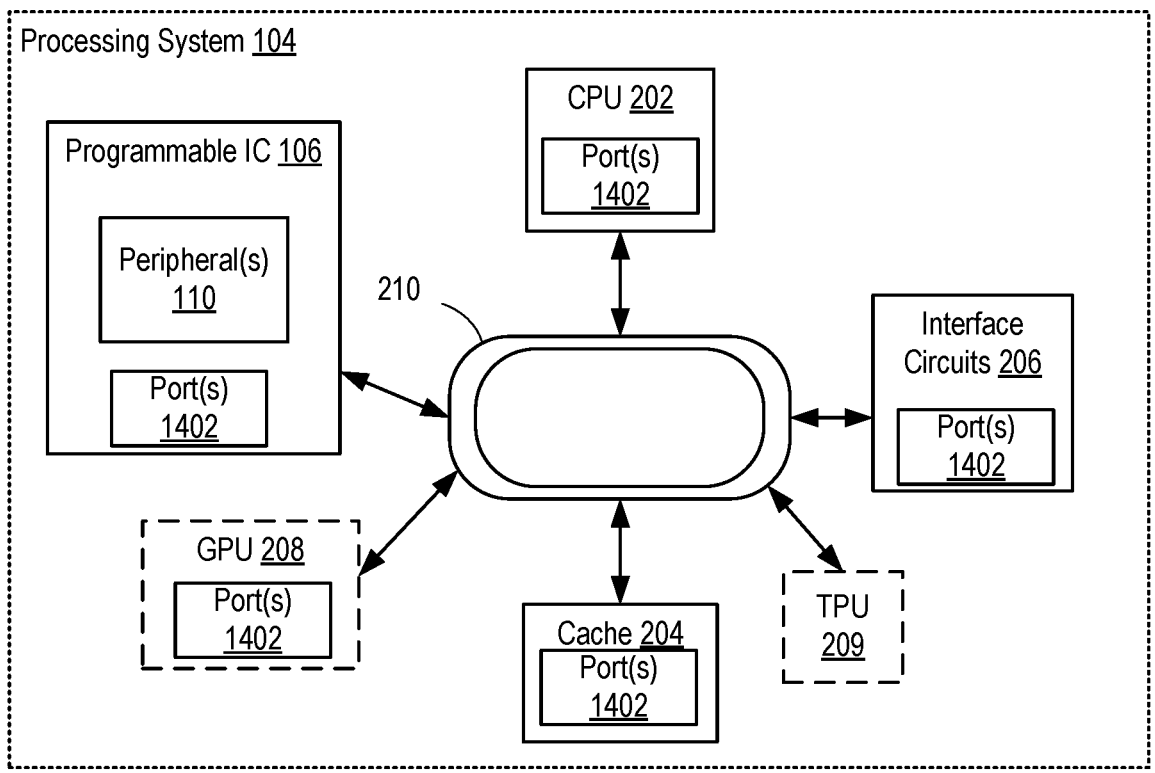
FIG. 15 is a block diagram depicting an example implementation of the IC package of FIG. 10 configured for communication using streaming interfaces.

FIG. 15 is a block diagram depicting an example implementation of the IC package 1002 configured for communication using streaming interfaces. In the example, each component coupled to the ring interconnect 210 can include one or more port(s) 1402. In one mode, the port(s) 1402 can be configured to communicate using memory addressing. In another mode, the port(s) 1402 can be configured to communicate using a streaming interface. An example streaming interface is the AMBA® AXI4 streaming interface, although other streaming interfaces can be used. In examples, the port(s) 1402 can support more than one streaming interface.

Figure 16:
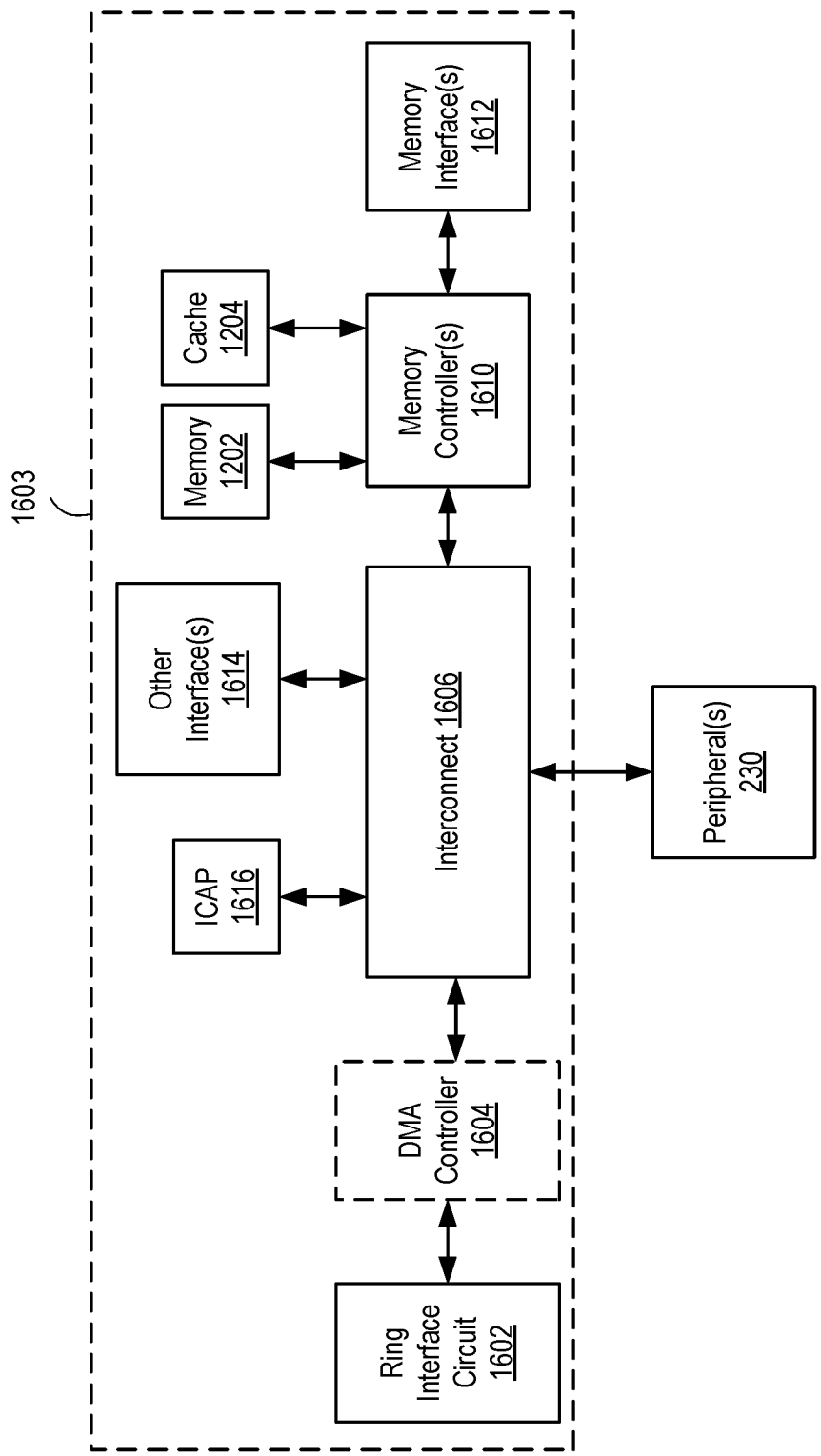
FIG. 16 is a block diagram depicting peripheral circuitry in more detail according to an example.

FIG. 16 is a block diagram depicting the peripheral circuitry 110 in more detail according to an example. This example of the peripheral circuitry 110 can be used when the programmable IC 106 is disposed on the same IC die as the processing system 104, as described in the various embodiments above (e.g., FIGS. 10-15). The peripheral circuitry 110 includes the interface circuits 1603 and the peripheral(s) 230. In the example, the interface circuits 1603 include the ring interface 1602, a DMA controller 1604, interconnect circuits ("interconnect 1606"), memory controller(s) 1610, memory interface(s) 1612, other interface(s) 1614. The interface circuits 1603 can include other circuits, which are omitted for clarity (e.g., decoupler circuits, debug circuits, etc). The ring interface circuit 1602 provides a physical interface to the ring interconnect 210. The ring interface circuit 1602 converts between the protocol of the ring interconnect 210 and the protocol of the interconnect 1606. The DMA controller 1604 facilitates DMA operations between the processing system 104 and the peripheral circuitry 110. In some examples, the DMA controller 1604 can be omitted and the ring interface circuit 1602 can be coupled to the interconnect 1606.

The interconnect 1606 couples the DMA controller 1604, the peripheral(s) 230, the memory controller(s) 1610, and the other interface(s) 1614. The memory controller(s) 410 is/are coupled to the memory interface(s) 1612. The memory interface(s) 1612 can be coupled to RAM external to the programmable IC 106, to RAM internal to the programmable IC 106 (e.g., the memory 1202 and/or the cache 1204), or a combination thereof. The other interface(s) 1614 can be coupled to other circuitry in the programmable IC 106 (e.g., other hardened circuits and/or programmed circuits).

In examples, the interconnect 1606 is implemented using an AXI interconnect defined as part of an ARM® Advanced Microcontroller Bus Architecture (AMBA®) standard. For example, the interconnect 406 can support AXI4, AXI4-Lite, and AXI4-Stream protocols. Each of the DMA controller 1604, the peripheral(s) 230, the other interface(s) 1614, and the memory controller(s) 1610 include one or more AXI masters and one or more AXI slaves for communication among each other.

In operation, the processing system 104 accesses the peripheral circuitry 110 through the ring interface circuit 1602. The processing system 104 can move data to, and receive data from, the peripheral circuitry 110 using memory-mapped or streaming transactions. The processing system 104 can move data directly to, and receive data directly from, the peripheral(s) 230. The processing system 104 can also move data to, and receive data from, the memory controller(s) 1610. For example, rather than sending and receiving data directly from the peripheral(s) 230, the processing system 104 can move data to the memory controller(s) 1610 for storage in RAM using DMA transactions. The peripheral(s) 230 can access and process the data stored in the RAM. The processing system 104 can then retrieve processed data from the RAM. In other examples, one or more of the memory controller(s) 1610 are not accessible by the processing system 104 and are private to the peripheral(s) 230.

The processing system 104 can also move data directly to, and receive data directly from, the other interface(s) 1614. Alternatively, rather than sending and receiving data directly from the other interface(s) 1614, the processing system 104 can move data to the memory controller(s) 1610 for storage in RAM. The other interface(s) 1614 can access and process the data stored in the RAM. The processing system 104 can then retrieve processed data from the RAM. In other examples, one or more of the other interface(s) 1614 are not accessible by the processing system 104 and are private to the peripheral(s) 230.

Figure 17:
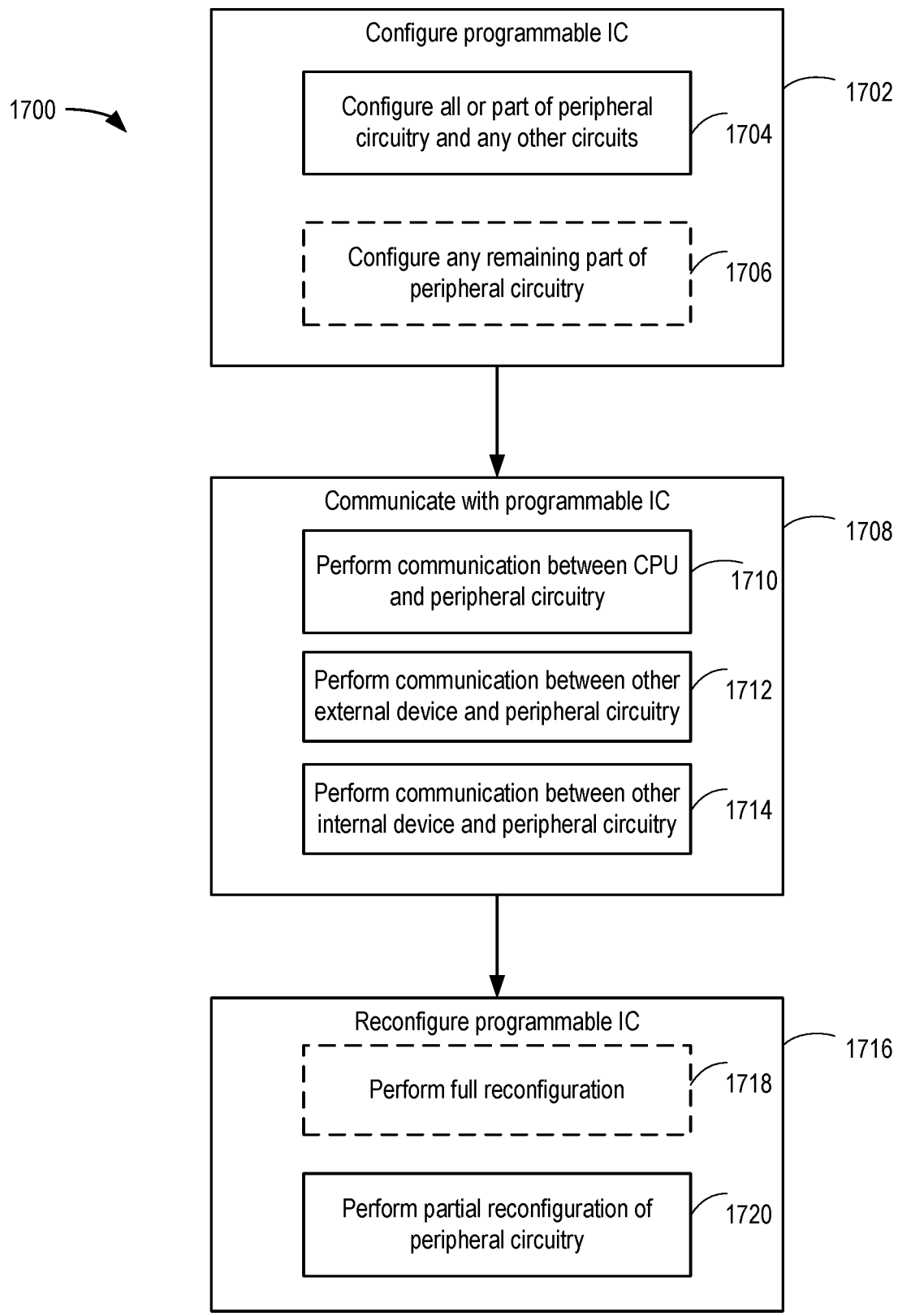
FIG. 17 is a flow diagram depicting a method of operating the programmable IC in the processing system according to an example.

FIG. 17 is a flow diagram depicting a method 1700 of operating the programmable IC 106 in the processing system 104 according to an example. Aspects of the method 900 can be understood with reference to FIGS. 10-16 above (i.e., when the programmable IC 106 is disposed on the same IC die as the processing system 104). The method 1700 includes three main phases: At block 1702, the programmable IC 106 is configured upon power-up of the processing system 104. A block 1708, device(s) communicate with the programmable IC 106. At block 1716, the programmable IC 106 is reconfigured during power-on of the IC package 102. There are various use cases for each of the three main phases of operating the programmable IC 106.

At power-on of the processing system 104, there are several different processes that can be used to configure the programmable IC 106. A master configuration mode can be used to configure the programmable IC 106 using an NVM disposed in the processing system 104 or disposed external to the processing system 104. A slave configuration mode can be used to configure the programmable IC 106 using the CPUs 202 or other device disposed on the processing system 104 or using a device external to the processing system 104.

At block 1704, at least a portion of the peripheral circuitry 110 is configured in the programmable IC 106. If any other circuitry is present, all or a portion of such other circuitry can also be configured in block 1704. Any of the master or slave modes can be used for configuration of the programmable IC 106 in block 1704. Configuration in block 1704 is typically hardware-driven, i.e., power is applied to the processing system 104 and the configuration process is performed by either the configuration logic 25 (master mode) or by an external device (slave mode).

In some cases, only a portion of the peripheral circuitry 110 is configured at block 1704. In such case, a remaining portion of the peripheral circuitry 110 can be configured at block 1706. Configuration in block 1706 can be either hardware-driven as described above or software-driven. In a software-driven process, for example, the programmable IC 106 can be partially reconfigured to implement the peripheral(s) 230 through an internal configuration access port (ICAP) 1616 (FIG. 16) using a CPU 202.

At block 1708, communication with the programmable IC 106 can be divided into three general categories: At block 1710, communication is performed between the a CPU 202 and the peripheral circuitry 110. At block 1712, communication is performed between an external device (external to the programmable IC 106) and the peripheral circuitry 110. At block 1714, communication is performed between an internal device (inside the programmable IC 106) and the peripheral circuitry 110.

In block 1710, a CPU 202 sends data to, and/or receives data from, the peripheral circuitry 110 over the ring interconnect 210. The processing system 104 can use memory-mapped or streaming transactions to transfer data to and from the peripheral circuitry 110 over the ring interconnect 210. In some cases, the processing system 104 can indirectly provide data to and from the peripheral circuitry 110 through a shared memory, which can be disposed either inside the programmable IC 106 or external to the programmable IC 106.

In block 1712, a device external to the programmable IC 106 communicates with the peripheral circuitry 110. The external device can be disposed inside the processing system 104 (e.g., on the ring interconnect 210) or external to the processing system 104. Alternatively, such a circuit can communicate indirectly with the peripheral circuitry 110 through a shared memory, which can be disposed either inside the programmable IC 106 or external to the programmable IC 106.

In block 1714, a device internal to the programmable IC 106 communicates with the peripheral circuitry 110. For example, a programmed or hardened circuit in the programmable IC 106 can communicate directly with the peripheral circuitry 110. Alternatively, such a circuit can communicate indirectly with the peripheral circuitry 110 through a shared memory, which can be disposed inside the programmable IC 106 or external to the programmable IC 106.

In block 1716, the programmable IC 106 can be reconfigured while power is applied to the processing system 104. For example, at block 1718, the programmable IC 106 can be reconfigured completely using similar processes as described in block 1702. Alternatively, at block 1720, the programmable IC 106 can be partially reconfigured. For example, one or more peripheral(s) 230 of the peripheral circuitry 110 can be reconfigured to implement different functionality.

While the foregoing is directed to specific examples, other and further examples may be devised without departing from the basic scope thereof, and the scope thereof is determined by the claims that follow.

What is claimed is:

1. An integrated circuit (IC) package, comprising:
a processing system and a programmable IC disposed on a substrate, the processing system coupled to the programmable IC through interconnect of the substrate;
the processing system including components coupled to a ring interconnect, the components including a processor and an interface controller; and
the programmable IC including: an interface endpoint coupled to the interface controller through the interconnect; and at least one peripheral coupled to the interface endpoint and configured for communication with the ring interconnect of the processing system through the interface endpoint and the interface controller.

2. The IC package of claim 1, wherein the programmable IC includes a programmable fabric.

3. The IC package of claim 2, wherein the programmable IC includes an embedded processing system coupled to the programmable fabric.

4. The IC package of claim 2, wherein the at least one peripheral is programmed in the programmable fabric.

5. The IC package of claim 1, wherein the interface controller and the interface endpoint each include one or more ports configured for communication using at least one streaming interface.

6. The IC package of claim 1, wherein the substrate includes a package interface, and wherein the programmable IC is coupled to the package interface.

7. The IC package of claim 1, further comprising:
one or more other ICs coupled to the processing system and the programmable IC.

8. An integrated circuit (IC) package, comprising:
a processing system and a programmable IC disposed on a semiconductor die;
the processing system including components coupled to a ring interconnect, the components including a processor and interface circuits;
the programmable IC coupled to the ring interconnect and including peripheral circuitry configured for communication with the ring interconnect, the peripheral circuitry including a static region of the programmable IC and a programmable region of the programmable IC, the static region including interface circuits configured for communication with the ring interconnect, the programmable region including at least one peripheral in communication with the interface circuits.

9. The IC package of claim 8, wherein the programmable IC includes a programmable fabric, and wherein the programmable region is disposed in the programmable fabric.

10. The IC package of claim 9, wherein the programmable IC includes an embedded processing system coupled to the programmable fabric.

11. The IC package of claim 8, wherein the processor and the programmable IC each include one or more ports configured for communication using at least one streaming interface.

12. An integrated circuit (IC) package, comprising:
a processing system and a programmable IC disposed on a semiconductor die;
the processing system including components coupled to a ring interconnect, the components including a processor, interface circuits, and memories;
the programmable IC coupled to the ring interconnect and including peripheral circuitry configured for communication with the ring interconnect and at least one memory, the peripheral circuitry including a static region of the programmable IC and a programmable region of the programmable IC, the static region including interface circuits configured for communication with the ring interconnect and the at least one memory, the programmable region including at least one peripheral in communication with the interface circuits.

13. The IC package of claim 12, wherein the at least one memory of the programmable IC is not coupled to the ring interconnect.

14. The IC package of claim 12, wherein the at least one memory of the programmable IC is coupled to the ring interconnect.

15. The IC package of claim 12, further comprising a package interface, wherein the programmable IC is coupled to the package interface.

16. The IC package of claim 12, wherein the programmable IC includes a programmable fabric, and wherein the programmable region is disposed in the programmable fabric.

17. The IC package of claim 16, wherein the programmable IC includes an embedded processing system coupled to the programmable fabric.

18. The IC package of claim 12, wherein the processor and the programmable IC each include one or more ports configured for communication using at least one streaming interface.

* * * * *